US006680543B2

(12) United States Patent
Hayashi et al.

(10) Patent No.: US 6,680,543 B2
(45) Date of Patent: *Jan. 20, 2004

(54) SEMICONDUCTOR INTEGRATED CIRCUIT AND SYSTEM

(75) Inventors: Jyoji Hayashi, Hirakata (JP); Hiroshi Kimura, Amagasaki (JP); Hiroshi Shimomura, Hirakata (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/341,595

(22) PCT Filed: Jan. 12, 1998

(86) PCT No.: PCT/JP98/00078

§ 371 (c)(1),
(2), (4) Date: Sep. 9, 1999

(87) PCT Pub. No.: WO98/31047

PCT Pub. Date: Jul. 16, 1998

(65) Prior Publication Data

US 2002/0053725 A1 May 9, 2002

(30) Foreign Application Priority Data

Jan. 13, 1997 (JP) ............................................. 9-003472
Jun. 20, 1997 (JP) ............................................. 9-164804

(51) Int. Cl.$^7$ .......................... H01L 23/48; H01L 29/76
(52) U.S. Cl. ..................... 257/776; 257/786; 257/386
(58) Field of Search ................................ 257/386, 776, 257/786, 394

(56) References Cited

U.S. PATENT DOCUMENTS 5,731,620 A * 3/1998 Mori .......................... 257/386

FOREIGN PATENT DOCUMENTS

| JP | 60-137050 | 7/1985 | |
| JP | 60137050 | * 7/1985 | ........... H01L/23/48 |
| JP | 1-231336 | 9/1989 | |
| JP | 9-82746 | 3/1997 | |
| JP | 09-082746 | 3/1997 | |

OTHER PUBLICATIONS

English Translation of International Search Report, dated Apr. 28, 1998, for PCT/JP98/00078.
Ahmadreza Rofougaran et al., "A 1 GHz CMOS RF Front–End IC for a Direct–Conversion Wireless Receiver", IEEE Journal of Solid–State Circuits, vol. 31, No. 7, Jul. 1996, pp. 880–889.
A1 GHz CMOS RF Front–End IC for a Direct–Conversion Wireless Receiver, vol. 31, No. 7, pp. 880–889, 1996.

* cited by examiner

Primary Examiner—Ori Nadav
(74) Attorney, Agent, or Firm—RatnerPrestia

(57) ABSTRACT

A semiconductor integrated circuit 10 includes a semiconductor substrate 1, an insulating layer 2 formed on the semiconductor substrate 1, and a bonding pad 3 formed on the insulating layer 2. The semiconductor substrate 1 has a region 4 facing the bonding pad 3 and a region 5 substantially surrounding at least a part of the region 4. The region 5 of the semiconductor substrate 1 is set substantially at an equipotential.

18 Claims, 25 Drawing Sheets

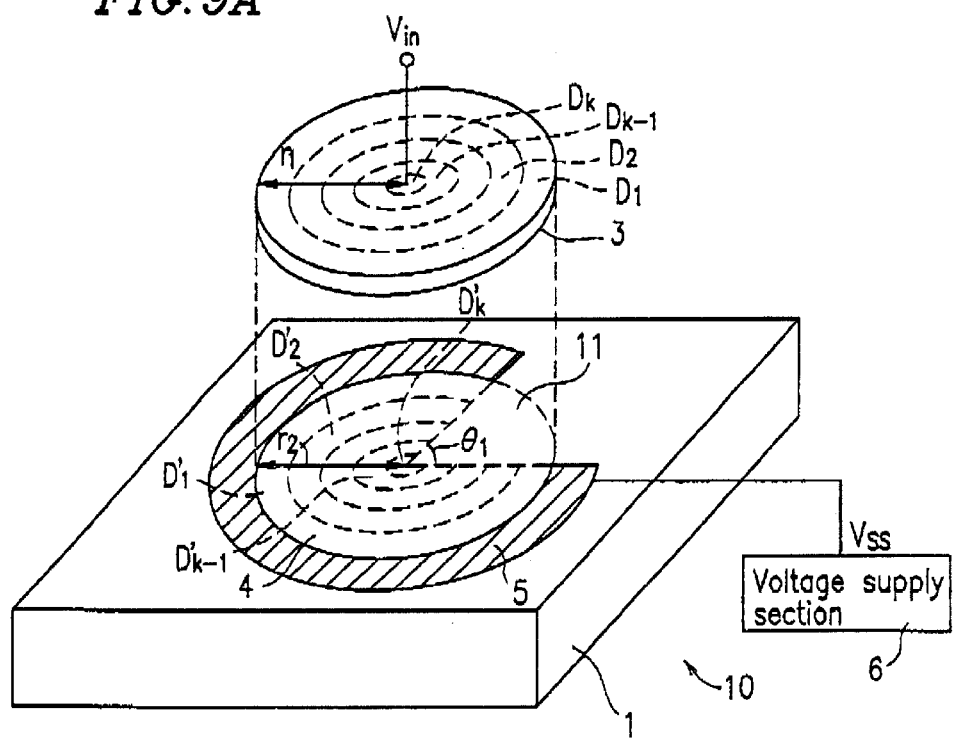
FIG. 9A
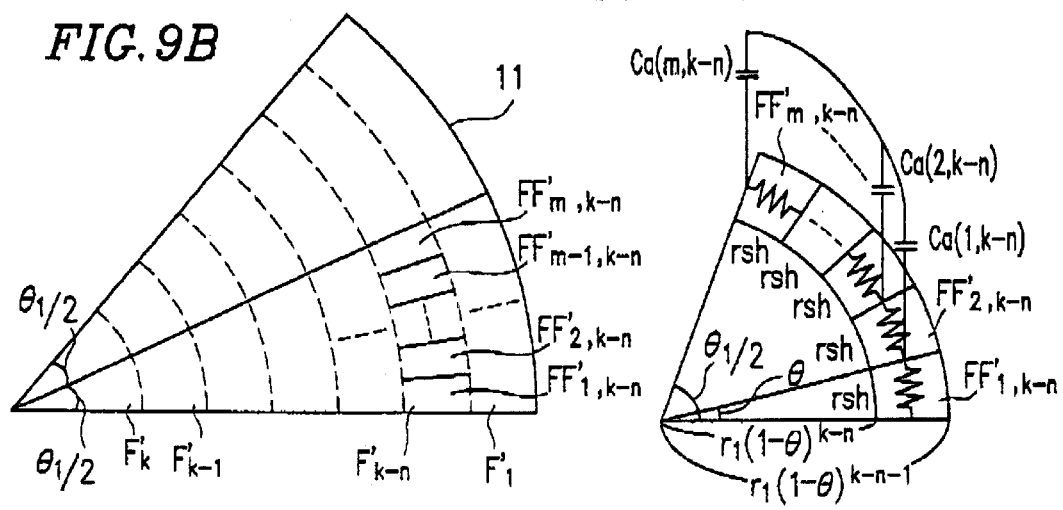
FIG. 9B
FIG. 9C

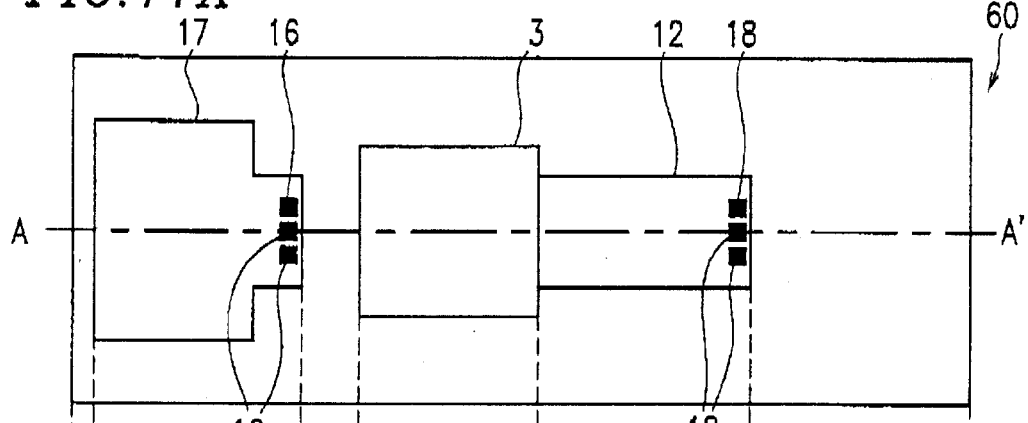
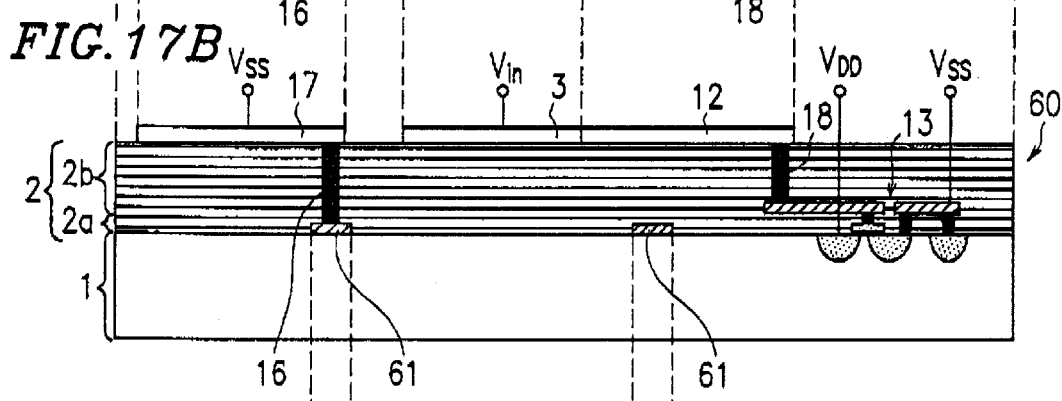
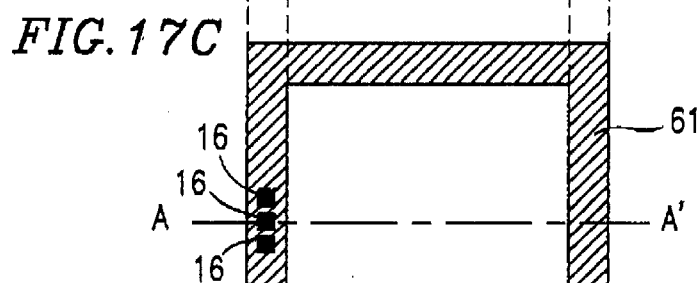
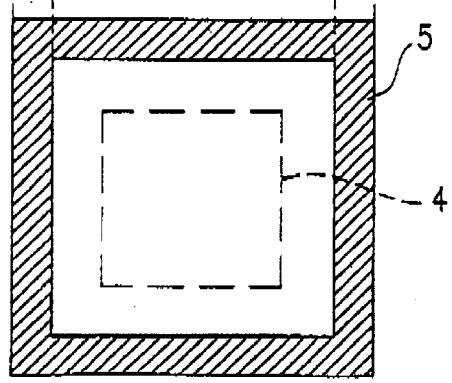

PRIOR ART

PRIOR ART

PRIOR ART

PRIOR ART

SEMICONDUCTOR INTEGRATED CIRCUIT AND SYSTEM

This Application is a U.S. National Phase Application of PCT International Application PCT/JP98/00078.

TECHNICAL FIELD

The present invention relates to a semiconductor integrated circuit and system for reducing a power loss and noise caused by a parasitic element of a bonding pad, and specifically a semiconductor integrated circuit and system having a pad structure suitable for inputting and outputting a signal having a high frequency.

BACKGROUND ART

In the field of computers, the clock frequency has been increased in order to operate the computers at a higher speed. This requires memories and other peripheral devices to input and output a signal having a higher frequency in order to realize a higher speed interface.

Communication systems are also required to have a capability of inputting and outputting a signal having a higher frequency at a lower power loss and lower noise. For example, digital cell phones such as PHS phones use a signal having a frequency of 1 GHz to 2 GHz. Accordingly, it is required to transmit and receive such a signal at a lower power loss and with lower noise.

FIG. 20 shows a structure of a conventional communication system 200. The communication system 200 includes an RF section 210 for transmitting or receiving a signal and a baseband signal processing section 220 for processing a signal to be transmitted or a signal received. Conventionally, the RF section 210 and the baseband signal processing section 220 are formed on different chips. For example, the RF section 210 is formed on a GaAs substrate, and the baseband signal processing section 220 is formed on a silicon substrate.

A signal received by an antenna 201 is input to a low noise amplifier (LNA) 211 of the RF section 210 through a transmitting/receiving switch 202. The LNA 211 amplifies the received signal. The amplified signal is input to a mixer 213 though a filter 212. The mixer 213 mixes the signal output from the filter 212 and an oscillation signal output from an oscillator 214. The output from the mixer 213 is supplied to the baseband signal processing section 220.

The baseband signal processing section 220 includes a converter 221 and a digital signal processor (DSP) 222. The converter 221 converts the analog signal output from the mixer 213 into a digital signal. The DSP 222 processes the digital signal.

The digital signal processed by the DSP 222 is converted into an analog signal by the converter 221. A mixer 215 of the RF section 210 mixes the signal output from the converter 221 and an oscillation signal output from the oscillator 214. A power amplifier (PA) 216 amplifies the output from the mixer 215. The amplified signal is transmitted from the antenna 201 through the transmitting/receiving switch 202.

FIG. 21 schematically shows an equivalent circuit from the antenna 201 to the LNA 211. In FIG. 21, the transmitting/receiving switch 202 is omitted. The antenna 201 is connected to a bonding pad 103 through a signal line 217. The bonding pad 103 is connected to an input section of the LNA 211 through a signal line 218. Thus, a signal received by the antenna 201 is input to the LNA 211 through the bonding pad 103.

FIG. 22 shows a semiconductor circuit 100 including the bonding pad 103. The semiconductor circuit 100 includes a semiconductor substrate 101, an insulating layer 102 formed on the semiconductor substrate 101, and the bonding pad 103 formed on the insulating layer 102. On the semiconductor substrate 101, a MOS transistor 113 is also formed. Herein, it is assumed that the MOS transistor 113 is included in the input section of the LNA 211. A signal received by the antenna 201 is input to the bonding pad 103 as a voltage signal $V_{in}$. The bonding pad 103 is connected to a gate of the MOS transistor 113. Accordingly, the voltage signal $V_{in}$ is applied to the gate of the MOS transistor 113.

FIG. 23 shows an equivalent circuit of the semiconductor circuit 100 shown in FIG. 22. In FIG. 23, $C_p$ represents a parasitic capacitance existing between the bonding pad 103 and the semiconductor substrate 101, and $R_p$ represents a parasitic resistance existing on a current path from the bonding pad 103 to a ground potential.

The impedance Z of the bonding pad 103 is represented by expression (1).

$$Z = (1/j\omega C_p) + R_p \qquad \text{expression (1)}$$

Herein, $C_p$ represents a parasitic capacitance, and $R_p$ represents a parasitic resistance. Letter j is a symbol indicating an imaginary number. $\omega = 2\pi f$, and f represents a frequency of the signal input to the bonding pad 103.

A power loss is generated by the impedance Z of the bonding pad 103.

The power loss $P_a$ based on the impedance Z of the bonding pad 103 is represented by expression (2).

$$P_a = \omega^2 C_p^2 R_p |V_{in}|^2 / (1 + \omega^2 C_p^2 R_p^2) \qquad \text{expression (2)}$$

Herein, $V_{in}$ represents a voltage applied to the bonding pad 103.

FIG. 24 shows the relationship among the parasitic resistance $R_p$, the parasitic capacitance $C_p$ and the power loss $P_a$. In FIG. 24, it is assumed that the frequency f of the signal input to the bonding pad 103 is 1 GHz.

In the conventional communication system 200, when the RF section 210 including the bonding pad 103 is formed on the GaAs substrate, the power loss $P_a$ is hardly a problem because the parasitic resistance $R_p$ is sufficiently large due to a very large resistance of the GaAs substrate.

However, the GaAs substrate is very expensive. Furthermore, when the RF section 210 is formed on the GaAs substrate, the RF section 210 and the baseband signal processing section 220 need to be formed on different chips from each other since it is preferable that the baseband signal processing section 220 is formed on a silicon substrate suitable for fabrication of a CMOS structure. This causes a problem that it is difficult to reduce the cost by forming main parts of the communication system 200 on a single chip.

When the RF section 210 and the baseband signal processing section 220 are formed on a single silicon chip, the parasitic capacitance $C_p$ is about 1 pF and the parasitic resistance $R_p$ is about 100 Ω. Therefore, the power lose based on the parasitic element of the bonding pad 103 is about several times as large as the power loss generated in the MOS transistor 113 (see FIG. 24). Accordingly, when the RF section 210 is formed on a silicon chip, the parasitic resistance $R_p$ needs to be reduced.

It is understood from FIG. 24 that the power loss $P_a$ can be reduced also by reducing the parasitic capacitance $C_p$. In order to reduce the parasitic capacitance $C_p$, the size of the bonding pad 103 needs to be reduced or the thickness of the insulating layer 102 needs to be increased. In consideration of the precision of the wire bonding, the size of the bonding pad 103 can only be reduced to a limited extent. It is difficult to increase the thickness of the insulating layer 102 in consideration of the other circuit elements formed on the semiconductor substrate 101. As can be appreciated, it is not very practical to reduce the power loss $P_a$ by reducing the parasitic capacitance $C_p$. Accordingly, it is desirable to reduce the parasitic resistance $R_p$ without substantially increasing the parasitic capacitance $C_p$.

FIG. 25 shows the relationship between the frequency f of the signal input to the bonding pad 103 and the power loss $P_a$. It is understood from FIG. 25 that, as the frequency of the signal input to the bonding pad 103 is increased, the parasitic resistance $R_p$ needs to be reduced by a greater degree.

The parasitic resistance $R_p$ also significantly influences the noise characteristic of the MOS transistor 113 connected to the bonding pad 103. The minimum noise $F_{min}$ of the MOS transistor 113 is generally represented by expression (3), which is referred to as the "fukui" equation.

$$F_{min}=1+2\pi f K C_{gs}\sqrt{((R_g+R_s)/gm)} \qquad \text{expression (3)}$$

Herein, $C_{gs}$, represents a gate-source capacitance of the MOS transistor 113. K represents a transistor-inherent constant. $R_g$ represents a gate resistance, and $R_s$ represents a source resistance.

An increase in the parasitic resistance $R_p$ is equivalent to an increase in $(R_g+R_s)$. As a result of the increase in the parasitic resistance $R_p$, the minimum noise $F_{min}$ of the MOS transistor 113 is increased. In order to suppress the increase in the noise, the parasitic resistance $R_p$ needs to be reduced.

A wireless receiver including an RF section and a baseband signal processing section formed on a single silicon substrate is disclosed in, for example, the following document.

IEEE JOURNAL OF SOLID-STATE CIRCUITS, VOL. 31, NO. 7, JULY 1996, pp. 880–889

FIG. 10 of the above-mentioned document shows a pad structure used in the RF section. The pad structure includes a first metal plate (Metal 1) and a second metal plate (Metal 2) facing each other. The first metal plate is formed on a silicon substrate in the state of being insulated from the silicon substrate. The second metal plate is formed on the first metal plate in the state of being insulated from the first metal plate. The first metal plate is connected to a ground potential.

With such a pad structure, when an input voltage is applied to the second metal plate, a current flowing from the second metal plate to the first metal plate flows from the first metal plate to the ground potential. Therefore, substantially no current flows in the silicon substrate. The parasitic resistance $R_p$ in this case is represented by a sum of the resistance of the first metal plate and the interconnect resistance from the first metal plate to the ground. Accordingly, the parasitic resistance $R_p$ is very small.

However, with the above-described pad structure, the first metal plate and the second metal plate face each other, and accordingly, the parasitic capacitance $C_p$ is increased. The increase in the parasitic capacitance $C_p$ causes the cutoff frequency $f_t$ of the MOS transistor connected to the second metal plate to be reduced. Furthermore, the increase in the parasitic capacitance $C_p$ breaks the insulating layer by a large force applied to the second metal plate at the time of bonding. As a result, the second metal plate and the first metal plate may be undesirably shortcircuited, or the first metal plate and the silicon substrate may be undesirably shortcircuited.

The present invention for solving the above-described problems has an objective of providing a semiconductor integrated circuit and system for reducing a power lose and noise caused by a parasitic element of a bonding pad by reducing a parasitic resistance $R_p$ without substantially increasing a parasitic capacitance $C_p$. Another objective of the present invention is to provide a semiconductor integrated circuit and system having a bonding pad suitable for inputting and outputting a signal having a high frequency.

DISCLOSURE OF THE INVENTION

A semiconductor integrated circuit according to the present invention includes a bonding pad; a semiconductor substrate electrically insulated from the bonding pad, the semiconductor substrate having a first region facing the bonding pad and a second region substantially surrounding at least a part of the first region; and setting means for setting the second region substantially at an equipotential.

The setting means includes voltage supply means for supplying a prescribed voltage; and connecting means for electrically connecting the voltage supply means to the second region of the semiconductor substrate.

In one embodiment, the connecting means includes a conductive section electrically connected to the voltage supply means and a plurality of contact portions discretely formed, and the plurality of contact portions each electrically connect the conductive section to the second region of the semiconductor substrate.

In one embodiment, a shape of the second region of the semiconductor substrate is determined by a shape of the conductive section.

In one embodiment, the conductive section has a shape substantially surrounding the first region of the semiconductor substrate.

In one embodiment, the conductive section has a plurality of basic cells arranged in an array.

In one embodiment, the connecting means includes a conductive section electrically connected to the voltage supply means and a contact portion continuously formed, and the contact portion electrically connects the conductive section to the second region of the semiconductor substrate.

In one embodiment, the second region of the semiconductor substrate is located outside the first region of the semiconductor substrate.

In one embodiment, the second region of the semiconductor substrate is located inside the first region of the semiconductor substrate.

In one embodiment, the semiconductor integrated circuit further includes a low resistance layer formed in at least a part of the first region of the semiconductor substrate.

In one embodiment, the equipotential is a ground potential.

A system according to the present invention includes a transmitting and receiving section for transmitting or receiving a signal; and a processing section for processing the signal to be transmitted or the signal received. The transmitting and receiving section includes a pad structure including a bonding pad, a semiconductor substrate electrically insulated from the bonding pad, the semiconductor substrate having a first region facing the bonding pad and a second region substantially surrounding at least a part of the first region, and means for setting the second region of the semiconductor substrate substantially at an equipotential.

In one embodiment, the transmitting and receiving section transmits or receives the signal through an antenna.

In one embodiment, the transmitting and receiving section transmits or receives the signal through an interface for connecting different semiconductor chips.

In one embodiment, the signal has a frequency of 100 MHz or more.

In one embodiment, the transmitting and receiving section and the processing section are formed on a single semiconductor chip.

In one embodiment, the transmitting and receiving section transmits and receives the signal.

BRIEF DESCRIPTION OF THE DRAWINGS

FIGS. 9A through 9E are views illustrating an equivalent circuit of the semiconductor integrated circuit 10 when there is a part of the region 4 which is not surrounded by the region 5.

FIG. 12 is a view showing a shape of a conductive layer 14a.

FIGS. 17A through 17E are views showing a structure of a semiconductor integrated circuit 60 in a fifth example according to the present invention.

BEST MODE FOR CARRYING OUT THE INVENTION

First, the basic principle of the present invention will be described.

Figure 1:
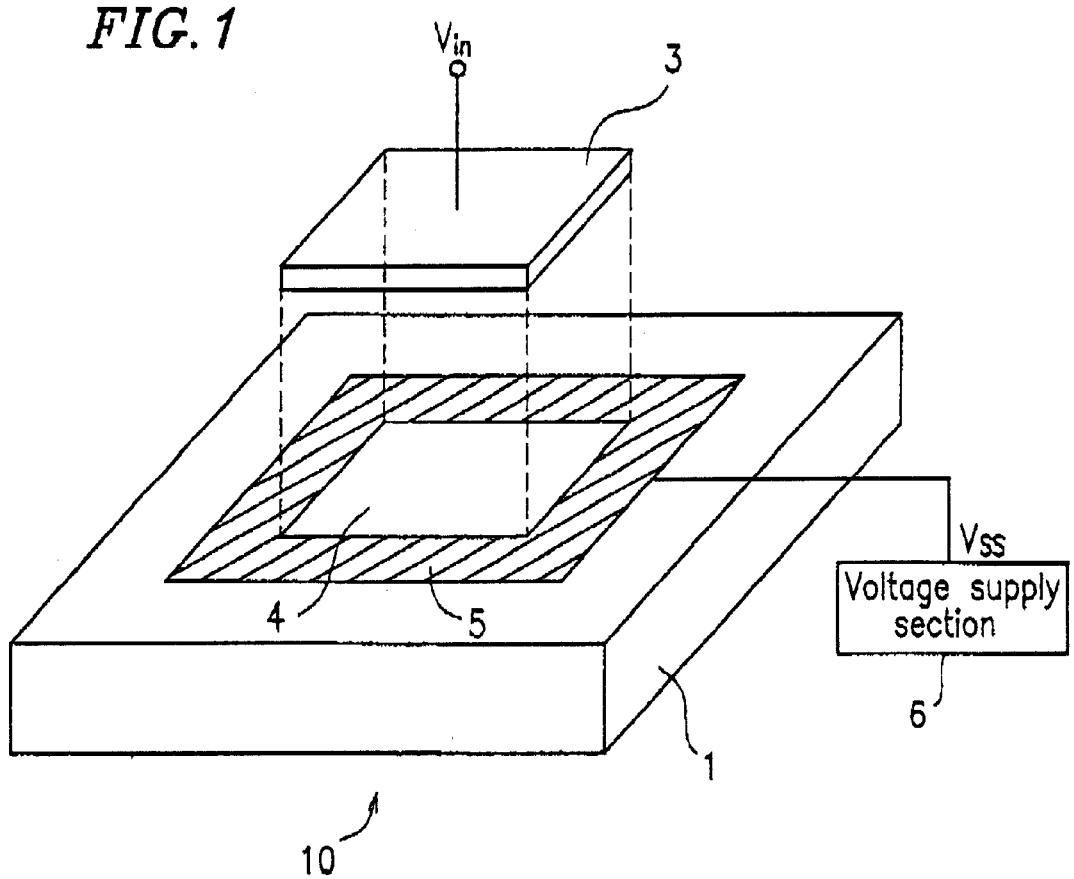
FIG. 1 is a view schematically showing a structure of a semiconductor integrated circuit 10 according to the present invention.

FIG. 1 schematically shows a structure of a semiconductor integrated circuit 10 according to the present invention. The semiconductor integrated circuit 10 includes a semiconductor substrate 1 and a bonding pad 3. The semiconductor substrate 1 and the bonding pad 3 are electrically insulated from each other. Typically, the semiconductor substrate 1 and the bonding pad 3 are electrically insulated from each other by providing an insulating layer between the semiconductor substrate 1 and the bonding pad 3. The semiconductor substrate 1 and the bonding pad 3 can be electrically insulated from each other by any other method.

The semiconductor substrate 1 has a region 4 facing the bonding pad 3 and a region 8 surrounding the region 4. The regions 4 and 5 are defined in one of the surfaces of the semiconductor substrate 1, the one surface facing the bonding pad 3.

The region 5 of the semiconductor substrate 1 is connected to a voltage supply section 6 for supplying a prescribed voltage potential. The prescribed voltage potential is preferably of a level at which the semiconductor integrated circuit is stable in a system in which the circuit is used. The prescribed voltage potential is, for example, a ground potential. Alternatively, the prescribed voltage potential can be a power supply potential $V_{DD}$. In this specification, such a prescribed voltage potential will be referred to as a "prescribed voltage potential $V_{ss}$". The voltage supply section 6 can be, for example, a terminal which is set to a prescribed voltage potential $V_{ss}$. The region 5 of the semiconductor substrate 1 is set substantially at an equipotential by connecting the region 5 to the voltage supply section 6 for supplying the prescribed voltage potential $V_{ss}$. The bonding pad 3 is supplied with a voltage $V_{in}$ of an input signal.

In the semiconductor integrated circuit 10, the parasitic capacitance $C_p$ and the parasitic resistance $R_p$ are calculated as follows. In the following calculations, the bonding pad 3 and the region 4 of the semiconductor substrate 1 facing the bonding pad 3 are assumed to be square. The shapes of the bonding pad 3 and the region 4 are not limited to a square. As described below, the bonding pad 3 and the region 4 can be polygons other than a square, or a circle.

The parasitic capacitance $C_p$ is calculated in accordance with expression (4). The parasitic capacitance $C_p$ is defined as a capacitance existing between the bonding pad 3 and the semiconductor substrate 1.

$$C_p = a^2 \times \epsilon / d \qquad \text{expression (4)}$$

Herein, a represents the length of one side of the bonding pad 3. $\epsilon$ is represented by a logical product of $\epsilon_1$ and $\epsilon_0$. $\epsilon_1$ represents a relative dielectric constant of the insulating material for insulating the bonding pad 3 and the semiconductor substrate 1 from each other. $\epsilon_0$ represents a vacuum dielectric constant. d represents a distance between the bonding pad 3 and the region 4.

The parasitic resistance $R_p$ is calculated in accordance with expression (5). The parasitic resistance $R_p$ is defined as a resistance existing between the bonding pad 3 and the voltage supply section 6.

$$R_p = \rho/16 \qquad \text{expression (5)}$$

Herein, $\rho$ represents a sheet resistance of the semiconductor substrate 1.

Hereinafter, the reason why the parasitic resistance $R_p$ is represented by expression (5) will be described.

Figure 2A:
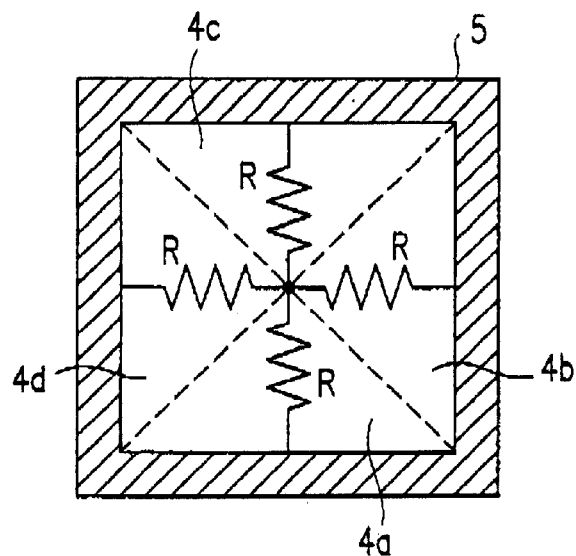
FIGS. 2A through 2C are views illustrating an equivalent circuit of the semiconductor integrated circuit 10 when a bonding pad 3 is square.
Figure 2B:
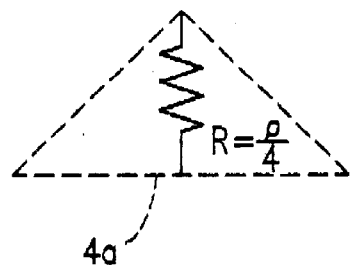

It is assumed that as shown in FIG. 2A, the region 4 of the semiconductor substrate 1 has four sub regions 4a through 4d. In this case, the resistance of each of the regions 4a through 4d is represented by a constant resistance R. As shown in FIG. 2B, the resistance R can be approximated to $\rho/4$. This is shown in expression (6).

$$R = \rho/4 \qquad \text{expression (6)}$$

Figure 2C:
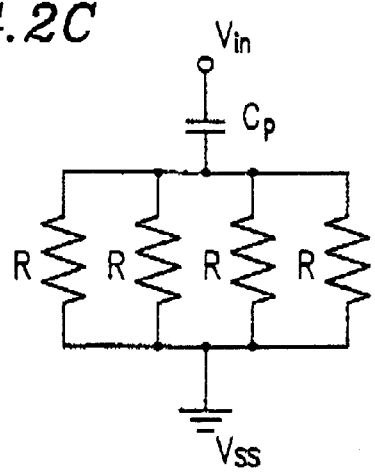

FIG. 2C shows an equivalent circuit of the semiconductor integrated circuit 10. The parasitic resistance $R_p$ is equivalent to four resistances R connected in parallel. This is shown in expression (7).

$$R_p = R/4 \qquad \text{expression (7)}$$

Expression (5) is obtained from expressions (6) and (7).

Figure 24:
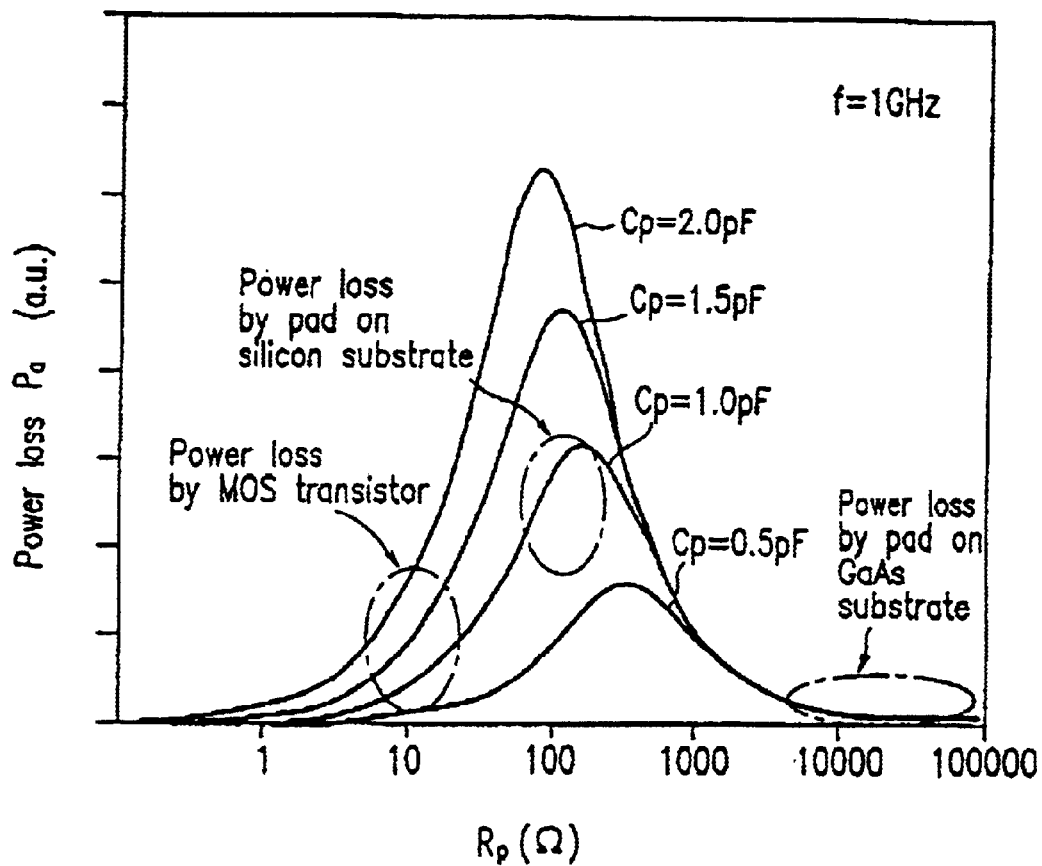
FIG. 24 is a graph showing the relationship among the parasitic resistance $R_p$, the parasitic capacitance $C_p$ and the power loss $P_a$.
Figure 25:
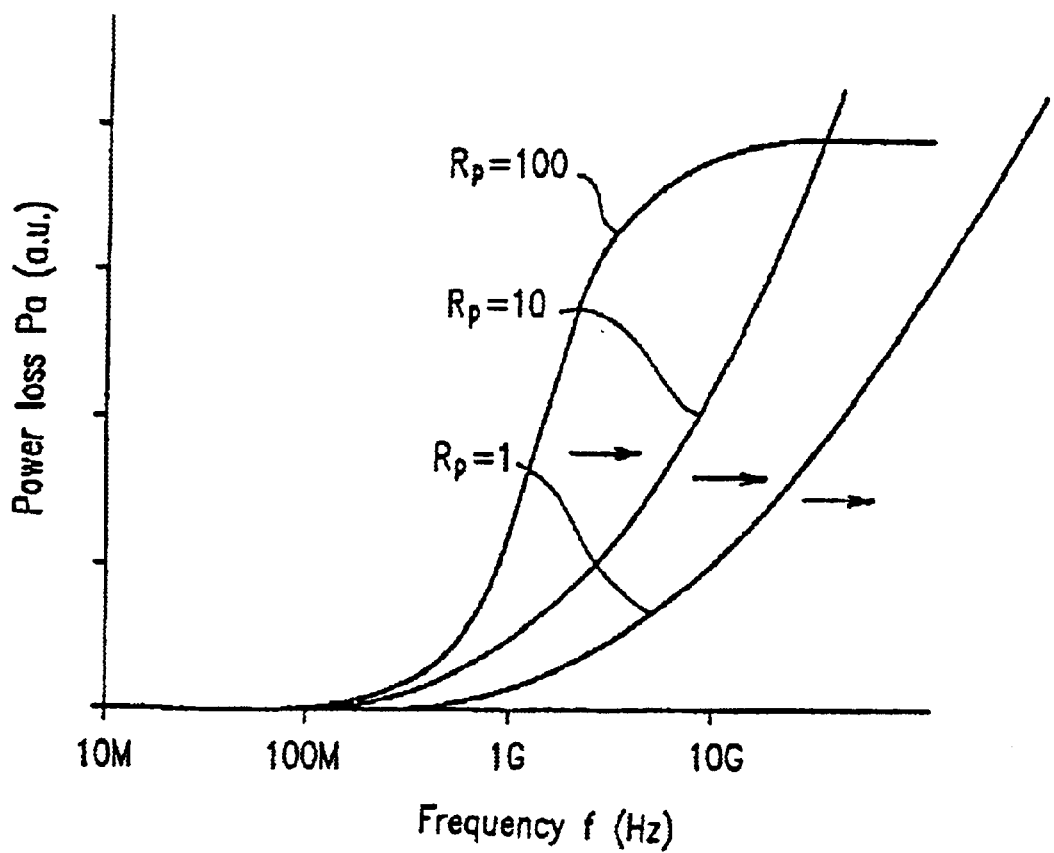
FIG. 25 is a graph showing the relationship between the frequency f of a signal input to the bonding pad 103 and the power loss $P_a$.

Hereinafter, the power loss of the semiconductor integrated circuit 10 will be evaluated. The evaluation conditions are: f=1 GHz, $\rho$=400 $\Omega$, and $C_p$=1 pF. f represents a frequency of a signal input to the bonding pad 3. Since parasitic capacitance $C_p$ is represented by expression (4), the parasitic capacitance $C_p$ can be easily made in the order of about 1 pF. By substituting $\rho$=400 $\Omega$ (one of the evaluation conditions) into expression (5), the parasitic resistance $R_p$ is 25 $\Omega$. Thus, in the semiconductor integrated circuit 10 according to the present invention, the parasitic resistance $R_p$ can be significantly lower than 100 $\Omega$, at which the power loss is substantially the peak under the same evaluation conditions. As a result, the power loss of the semiconductor integrated circuit 10 can be reduced to about ¼ (see FIG. 24) of the power loss when the parasitic resistance $R_p$ is 100 $\Omega$.

Under the evaluation conditions of f=1 GHz, $\rho$=1000 $\Omega$, and $C_p$=1 pF, the parasitic resistance $R_p$ is 63 $\Omega$. As a result, the power loss can be reduced to about ⅘ (see FIG. 24).

Since the parasitic resistance $R_p$ is reduced, the noise generation can be suppressed.

The shapes of the bonding pad 3 and the region 4 are not limited to a square. Even when the bonding pad 3 and the region 4 are hexagonal, the power loss of the semiconductor integrated circuit 10 can be reduced by surrounding the region 4 by the region 5.

Figure 3A:
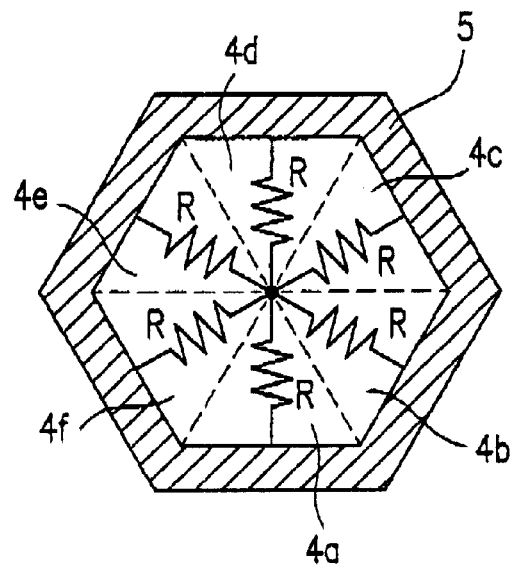
FIGS. 3A through 3C are views illustrating an equivalent circuit of the semiconductor integrated circuit 10 when the bonding pad 3 is hexagonal.
Figure 3B:
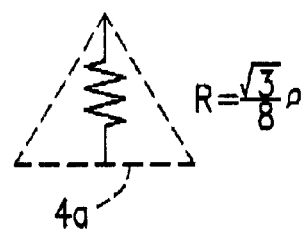

It is assumed that, as shown in FIG. 3A, the region 4 of the semiconductor substrate 1 has six sub regions 4a through 4f. In this case, the resistance of each of the regions 4a through 4f is represented by a constant resistance R. As shown in FIG. 3B, the resistance R can be approximated to $(\sqrt{3}/8)\rho$. This is shown in expression (8).

$$R = (\sqrt{3}/8)\rho \qquad \text{expression (8)}$$

Figure 3C:
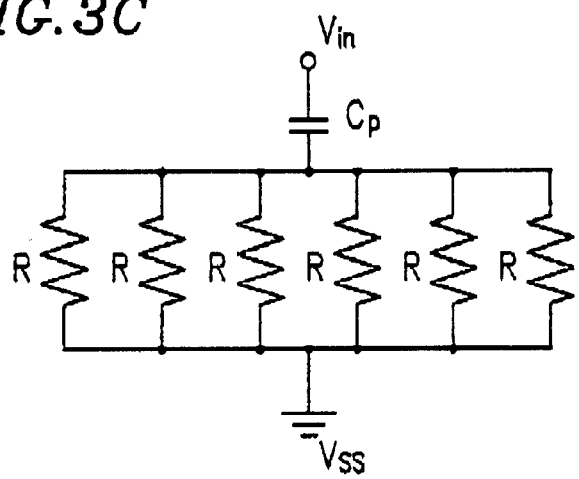

FIG. 3C shows an equivalent circuit of the semiconductor integrated circuit 10. The parasitic resistance $R_p$ is equivalent to six resistances R connected in parallel. This is shown in expression (9).

$$R_p = R/6 \qquad \text{expression (9)}$$

Expression (10) is obtained from expressions (8) and (9).

$$R_p = (\sqrt{3}/48)\rho \qquad \text{expression (10)}$$

The power loss of the semiconductor integrated circuit 10 will be evaluated. The evaluation conditions are: f=1 GHz, $\rho$=400 $\Omega$, and $C_p$=1 pF. By substituting $\rho$=400 $\Omega$ (one of the evaluation conditions) into expression (10), the parasitic resistance $R_p$ is about 14 $\Omega$. Thus, in the semiconductor integrated circuit 10 according to the present invention, the parasitic resistance $R_p$ can be significantly lower than 100 $\Omega$, at which the power loss is substantially the peak under the same evaluation conditions. As a result, the power loss of the semiconductor integrated circuit 10 can be reduced to about ⅕ (see FIG. 24) of the power loss when the parasitic resistance $R_p$ is 100 $\Omega$.

Under the evaluation conditions of f=1 GHz, $\rho$=1000 $\Omega$, and $C_p$=1 pF, the parasitic resistance $R_p$ is about 37 $\Omega$. As a result, the power loss can be reduced to about ½ (see FIG. 24).

Even when the bonding pad 3 and the region 4 are circular, the power loss of the semiconductor integrated circuit 10 can be reduced by surrounding the region 4 by the region 5.

Figure 4A:
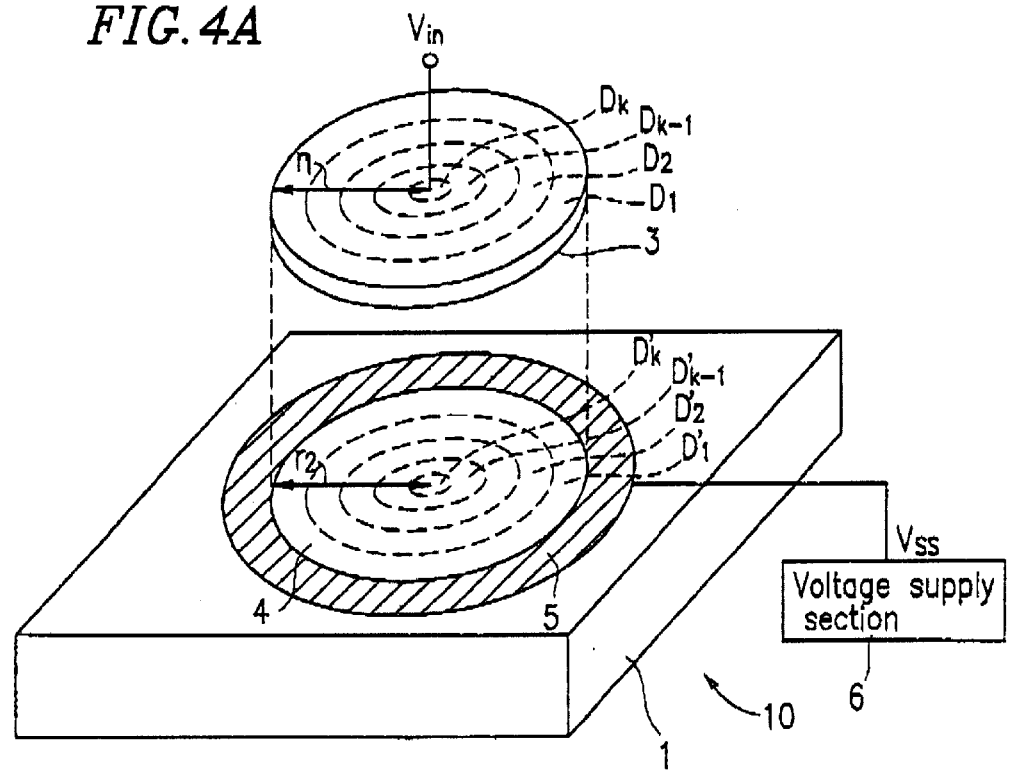
FIGS. 4A through 4D are views illustrating an equivalent circuit of the semiconductor integrated circuit 10 when the bonding pad 3 is circular.

FIG. 4A schematically shows a structure of the semiconductor integrated circuit 10 in which the bonding pad 3 and the region 4 of the semiconductor substrate 1 are circular. The region 5 is ring-shaped so as to surround the region 4. In the example shown in FIG. 4A, it is assumed that $r_1 = r_2$. $r_1$ represents the radius of the bonding pad 3 and the region 4 facing the bonding pad 3. $r_2$ represents the inner radius of the region 5.

Herein, the parasitic capacitance $C_p$ and the parasitic resistance $R_p$ are calculated using an "area division model". It is assumed that the bonding pad 3 has a plurality of areas $D_1$ through $D_k$ divided concentrically. The region 4 has a plurality of areas $D'_1$ through $D'_k$ corresponding thereto, respectively.

Figure 4B:
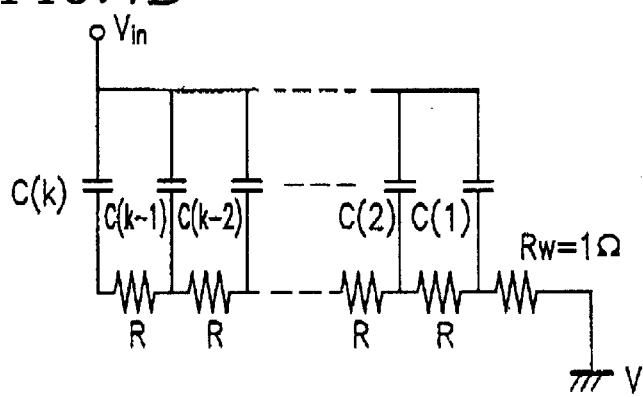

FIG. 4B shows an equivalent circuit of the semiconductor integrated circuit 10 shown in FIG. 4A. In FIG. 4B, C(k–n) represents a capacitance existing between area $D_{(k-n)}$ of the bonding pad 3 and area $D'_{(k-n)}$ of the semiconductor substrate 1. R represents a resistance existing between an outer periphery and an inner periphery of area $D'_{(k-n)}$ of the semiconductor substrate 1. Here, n is an integer of 0 or more and k–1 or less. $R_w$ represents a resistance existing between the region 5 and the voltage supply section 6 for supplying 4 prescribed voltage potential $V_{ss}$.

Figure 4C:
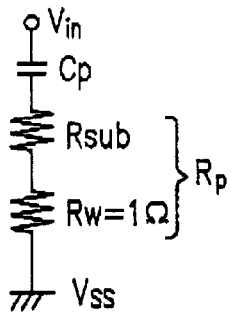

FIG. 4C shows a simplified equivalent circuit of the semiconductor integrated circuit 10. The semiconductor integrated circuit 10 is equivalent to a circuit including the parasitic capacitance $C_p$ and the parasitic resistance $R_p$ connected in series. The parasitic capacitance $C_p$ is obtained by synthesizing k pieces of capacitances C(1) through C(k). The parasitic resistance $R_p$ is equivalent to a circuit including a substrate resistance $R_{sub}$ and a resistance $R_w$ connected in series. The parasitic resistance $R_p$ can be considered to be substantially equal to the substrate resistance $R_{sub}$ with no substantial inconvenience because the resistance $R_w$ is sufficiently small compared to the substrate resistance $R_{sub}$. For example, the resistance $R_w$ is 1 $\Omega$. The substrate resistance $R_{sub}$ can be obtained by synthesizing k pieces of resistances R.

The resistance R is calculated in accordance with expression (11).

$$R = \rho \times \theta / 2\pi \quad \text{expression (11)}$$

Herein, ρ represents a sheet substrate of the semiconductor substrate 1. θ represents a central angle of a fan-shaped area 8. The region 4 can be approximated by arranging $2\pi/\theta$ pieces of fan-shaped areas 8 having the central angle of θ around the center of the region 4.

Figure 4D:
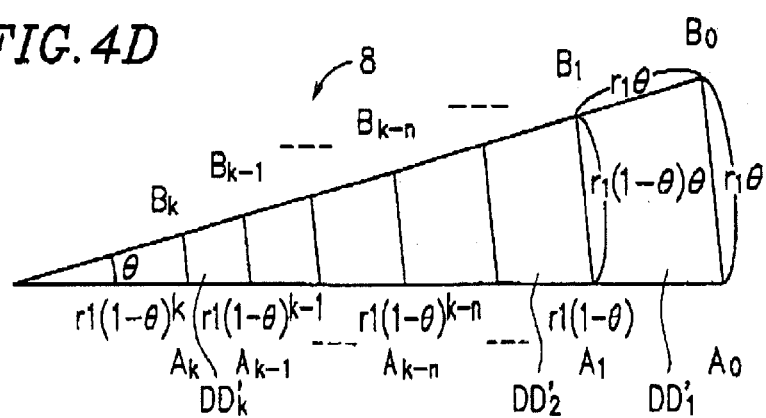

FIG. 4D shows a structure of the fan-shaped area 8. The fan-shaped area 8 includes k pieces blocks $DD'_1$ through $DD'_k$. The position of line segment $A_1B_1$ is determined so that the length of line segment $B_0B_1$ is equal to the length of line segment $A_0B_0$. Quadrangle $A_0A_1B_1B_0$ is defined as block $DD'_1$. In a similar manner, the position of line segment $A_{k-n}B_{k-n}$ is determined so that the length of line segment $B_{k-n-1}B_{k-n}$ is equal to the length of line segment $A_{k-n-1}B_{k-n-1}$. Quadrangle $A_{k-n-1}A_{k-n}B_{k-n}B_{k-n-1}$ is defined as block $DD'_{k-n}$. Herein, n is an integer of 0 or more and k−1 or less. When θ is sufficiently smaller than 1, block $DD'_{k-n}$ can be regarded as a square since, when θ<<1, it can be regarded that the length of line segment $A_{k-n}B_{k-n}$ is nearly equal to the length of line segment $A_{k-n-1}B_{k-n-1}$.

In the following description, it is assumed that θ=1/100. In this case, block $DD'_{k-n}$ can be regarded as a square. Accordingly, the resistance between line segment $A_{k-n}B_{k-n}$ and line segment $A_{k-n-1}B_{k-n-1}$ is equal to the sheet resistance ρ of the semiconductor substrate 1. Area $D'_{k-n}$ can be approximated by arranging $2\pi/\theta$ pieces of blocks $DD'_{k-n}$ around the center of the region 4. Accordingly, the resistance existing between an outer periphery and an inner periphery of area $D'_{k-n}$ is represented by expression (11).

The capacitance C(k−n) is calculated in accordance with expression (12).

$$C(k-n) = cap \times \pi \times r_1^2 (1-\theta)^{2k-2n-2} \theta(2-\theta) \times 2\pi/\theta \quad \text{expression (12)}$$

Herein, cap represents a capacitance per unit area. Here, it is assumed that $cap \times \pi \times r_1^2 = 1$ pF in order to simplify the calculation.

Figure 5:
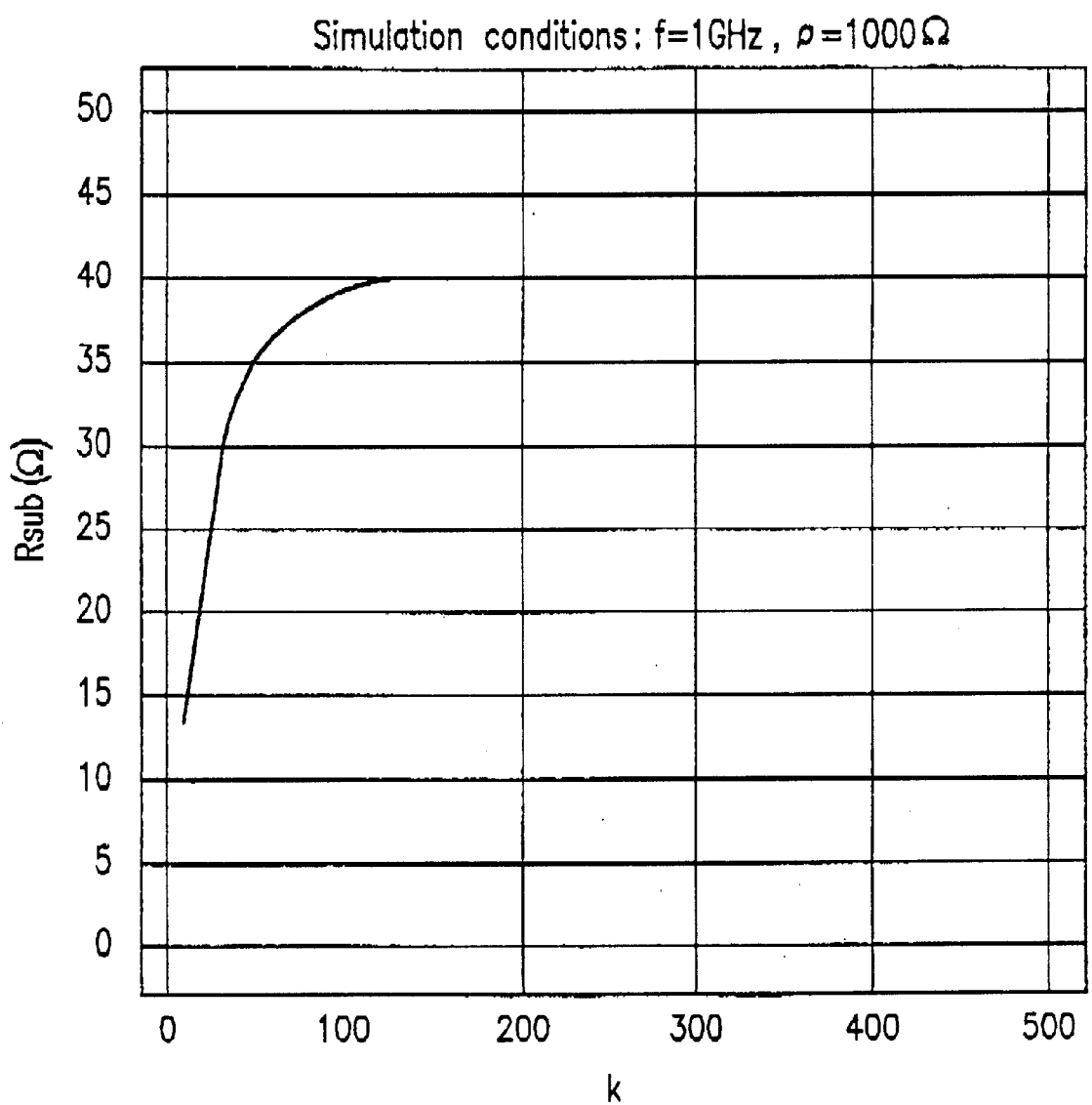
FIG. 5 is a graph showing the relationship between the value of k and the value of a substrate resistance $R_{sub}$.

FIG. 5 shows the results of simulation based on the equivalent circuit shown in FIG. 4B. The conditions for simulation are f=1 GHz and ρ=1000 Ω. In FIG. 5, the horizontal axis indicates the value of k, and the vertical axis indicates the value of the substrate resistance $R_{sub}$ which is obtained by synthesizing k pieces of resistances R. It is appreciated that, in the range of k≧200, the value of the substrate resistance $R_{sub}$ is converged to 40 Ω. As the value of k is higher, the precision of the value of the substrate resistance $R_{sub}$ becomes higher. However, when the value of k is excessively high, the calculation time required for the simulation is extended. In actuality, k=460 is sufficient. As can be appreciated, according to the simulation performed based on the area division model, the parasitic resistance $R_p$ is reduced to about 1/25 of the sheet resistance ρ of the semiconductor substrate 1. As a result, the power loss of the semiconductor integrated circuit 10 can be reduced to about ½ of the power loss when the parasitic resistance $R_p$ is 100 Ω.

The regions 4 and 5 of the semiconductor substrate 1 can have various modifications in terms of shapes and arrangements. Such modifications should be construed to be included in the scope of the present invention as long as the above-described principle of the present invention is applied. At least the modifications described below are included in the scope of the present invention.

In the semiconductor integrated circuit 10, the inner periphery of the region 5 does not need to match the outer periphery of the region 4. At least a part of the region 5 can be located inside the region 4 as long as a similar effect is obtained with the case where the inner periphery of the region 5 matches the outer periphery of the region 4. Alternatively, at least a part of the region 5 can be located outside the region 4.

Figure 6A:
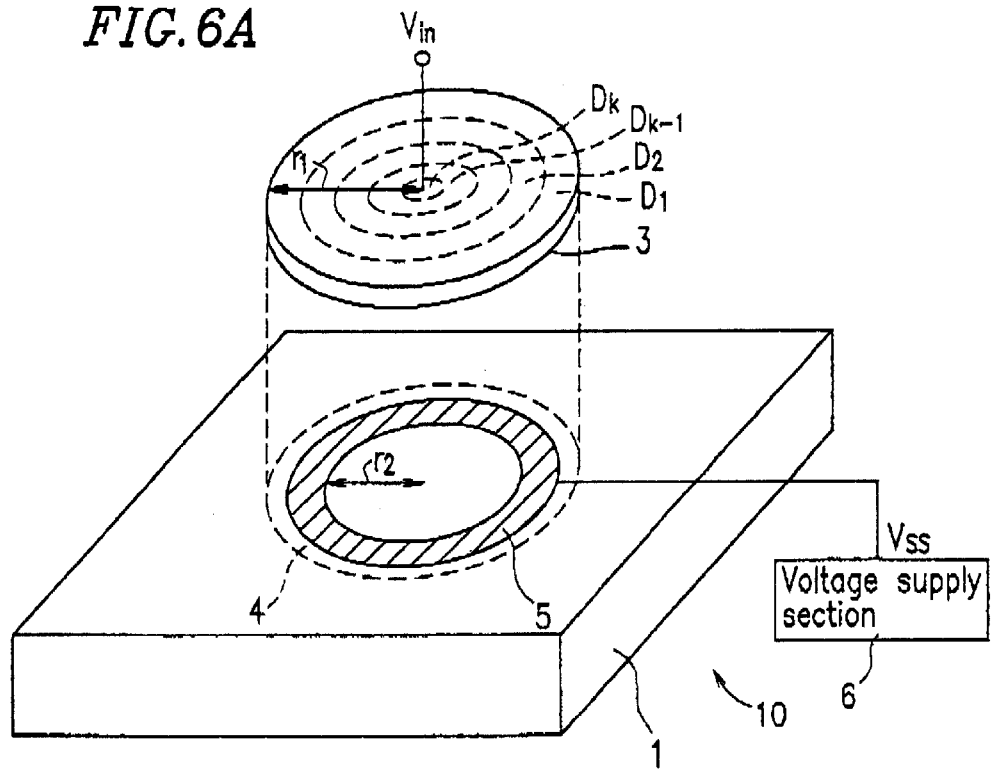
FIGS. 6A through 6C are views illustrating an equivalent circuit of the semiconductor integrated circuit 10 when a region 5 is inside a region 4.

FIG. 6A schematically shows a structure of the semiconductor integrated circuit 10 in which the region 5 is located inside the region 4. In the example shown in FIG. 6A, $r_1 > r_2$. Herein, $r_1$ represents the radius of the bonding pad 3 and the region 4 facing the bonding pad 3. $r_2$ represents the inner radius of the region 5.

Figure 6B:
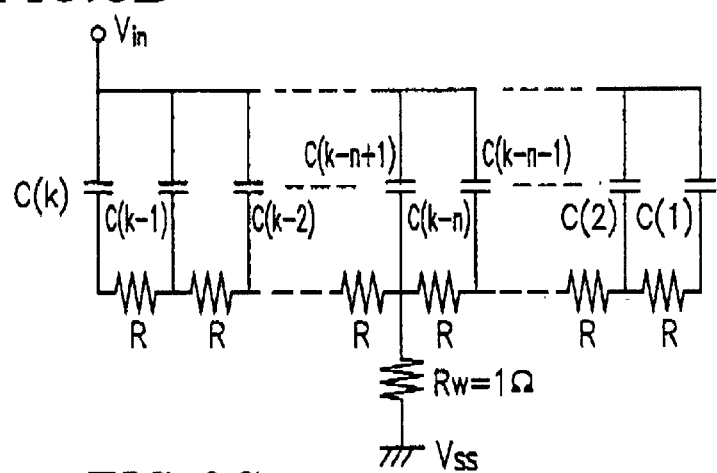

FIG. 6B shows an equivalent circuit of the semiconductor integrated circuit 10 shown in FIG. 6A. It is assumed that $r_2 = r_1(1-\theta)^{k-n}$ (n<k). In FIG. 6B, identical elements with those shown in FIG. 4B bear identical reference numerals.

Figure 6C:
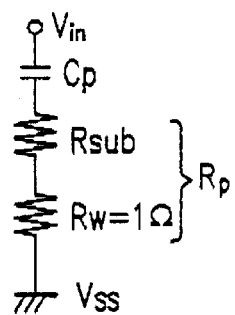

FIG. 6C shows a simplified equivalent circuit of the semiconductor integrated circuit 10. The semiconductor integrated circuit 10 is equivalent to a circuit including a parasitic capacitance $C_p$ and a parasitic resistance $R_p$ connected in series. The parasitic capacitance $C_p$ is obtained by synthesizing k pieces of capacitances C(1) through C(k). The parasitic resistance $R_p$ is equivalent to a circuit including a substrate resistance $R_{sub}$ and a resistance $R_w$ connected in series. The substrate resistance $R_{sub}$ can be obtained by synthesizing k pieces of resistances R.

Figure 7A:
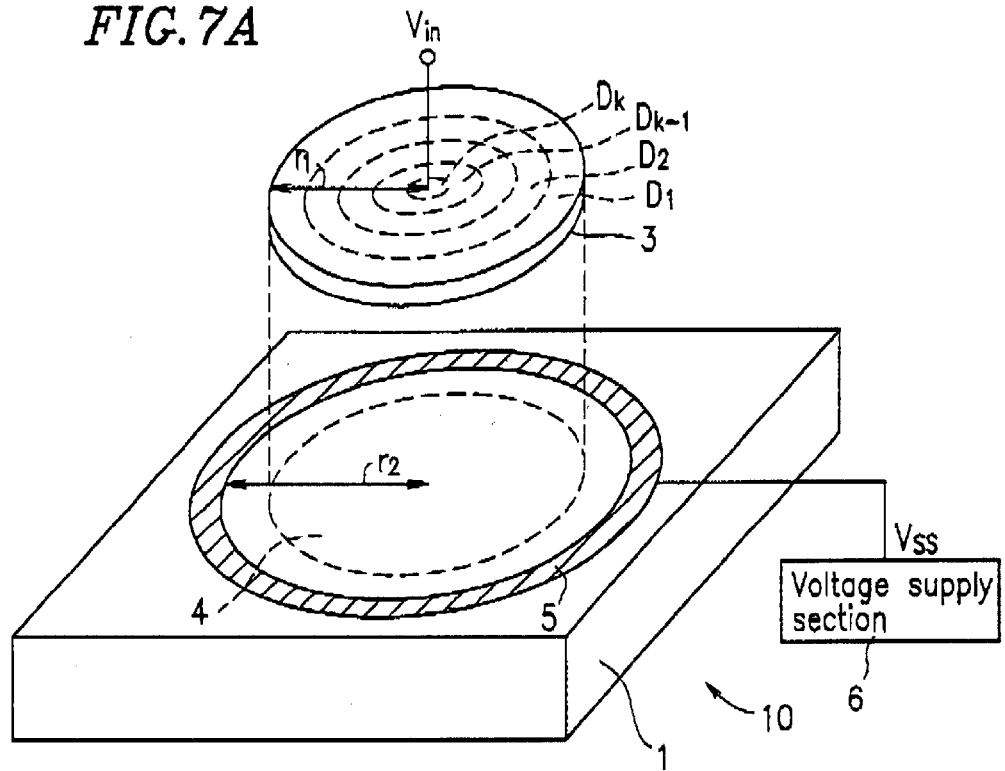
FIGS. 7A through 7C are views illustrating an equivalent circuit of the semiconductor integrated circuit 10 when the region 5 is outside the region 4.

FIG. 7A schematically shows a structure of the semiconductor integrated circuit 10 in which the region 5 is located outside the region 4. In the example shown in FIG. 7A, $R_1 < r_2$. Herein, $r_1$ represents the radius of the bonding pad 3 and the region 4 facing the bonding pad 3. $r_2$ represents the inner radius of the region 5.

Figure 7B:
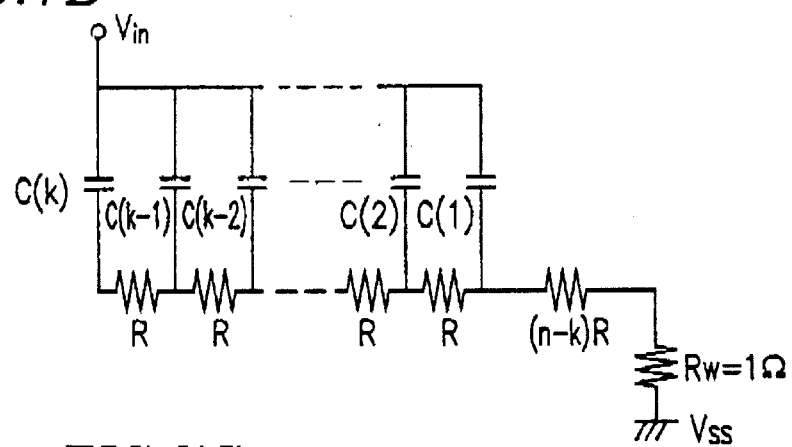

FIG. 7B shows an equivalent circuit of the semiconductor integrated circuit 10 shown in FIG. 7A. It is assumed that $r_2 = r_1(1-\theta)^{k-n}$ (n>k). In FIG. 7B, identical elements with those shown in FIG. 4B bear identical reference numerals.

Figure 7C:
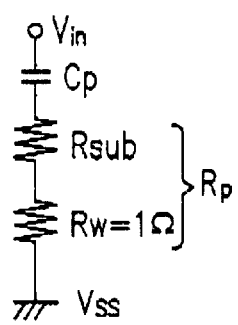

FIG. 7C shows a simplified equivalent circuit of the semiconductor integrated circuit 10. The semiconductor integrated circuit 10 is equivalent to a circuit including a parasitic capacitance $C_p$ and a parasitic resistance $R_p$ connected in series. The parasitic capacitance $C_p$ is obtained by synthesizing k pieces of capacitances C(1) through C(k). The parasitic resistance $R_p$ is equivalent to a circuit including a substrate resistance $R_{sub}$ and a resistance $R_w$ connected in series. The substrate resistance $R_{sub}$ can be obtained by synthesizing k pieces of resistances R and (n−k)R. Herein, (n−k)R represents a resistance existing between the outer periphery of the region 4 and the inner periphery of the region 5.

Figure 8:
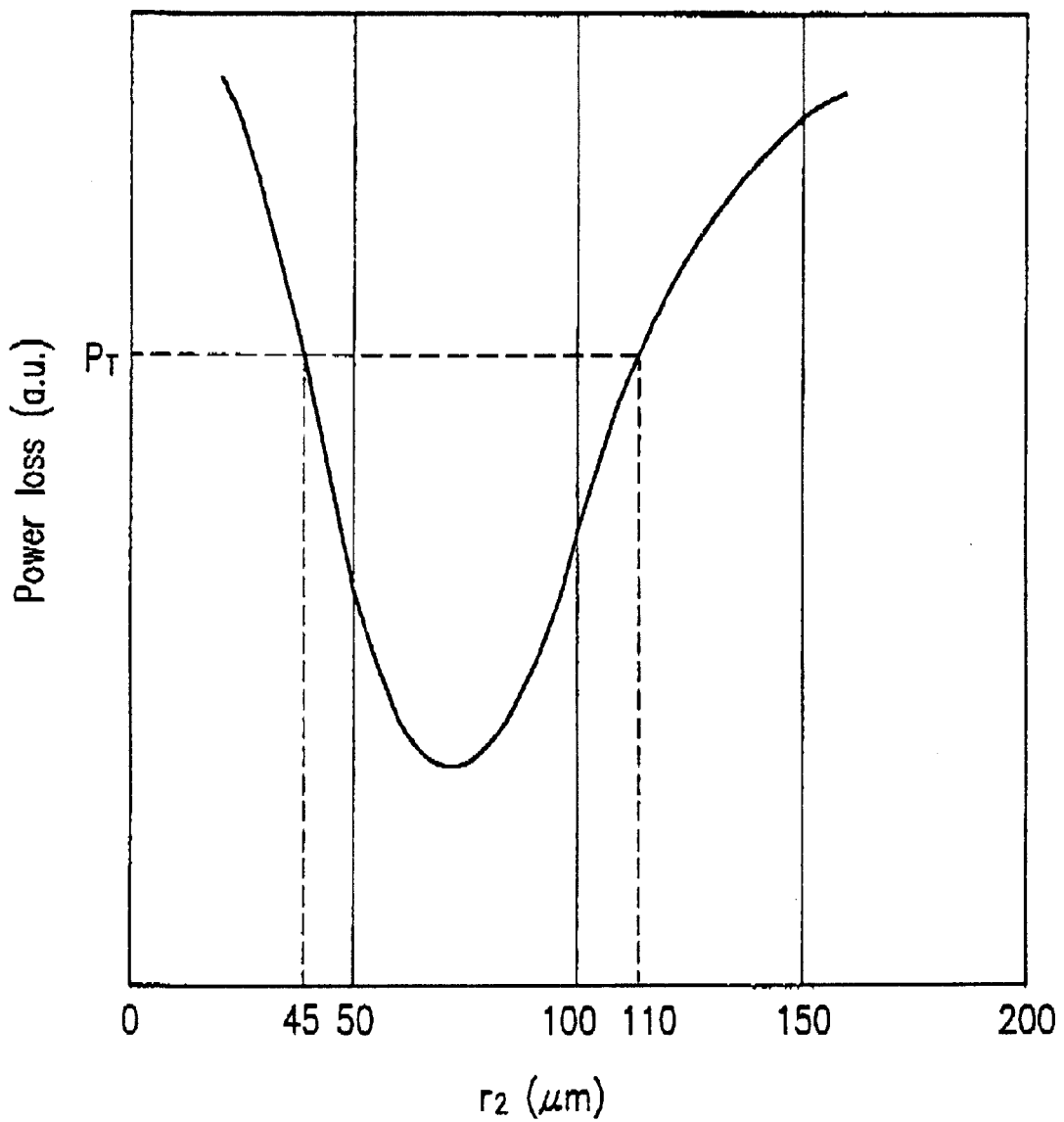
FIG. 8 is a graph showing the relationship between the inner radius $r_2$ of the region 5 and the power loss.

FIG. 8 shows the results of simulation based on the equivalent circuit shown in FIGS. 6B and 7B. The conditions for simulation are $r_1 = 100 \mu m$, f=1 GHz and ρ=1000 Ω. In FIG. 8, the horizontal axis indicates the value of the inner radius $r_2$ of the region 5, and the vertical axis indicates the power loss of the semiconductor integrated circuit 10. It is understood from FIG. 8 that the power loss can be reduced at a point at which $r_1 = r_2$ and the vicinity thereof. For example, in order to make the power loss of the semiconductor integrated circuit 10 to a tolerable value $P_\gamma$ (for example, 2.0 mW) or less, the inner radius $r_2$ of the region 5 is set so as to fulfill $45 \mu m \leq r_2 \leq 110 \mu m$. In this manner, by surrounding at least a part of the region 4 by the region 5, the power loss of the semiconductor integrated circuit 10 can be reduced.

In the semiconductor integrated circuit 10, the region 5 does not need to completely surround the region 4. There can be a part of the region 4 which is not surrounded by the region 5 as long as a similar effect is obtained to the case where the region 5 completely surrounds the region 4.

FIG. 9A schematically shows a structure of the semiconductor integrated circuit 10 in which there is a part of the region 4 which is not surrounded by the region 5. In the example shown in FIG. 9A, the region 5 does not exist in a part corresponding to a fan-shaped area 11 having a central angle $\theta_1$, $r_1=r_2$. Herein, $r_1$ represents the radius of the bonding pad 3 and the region 4 facing the bonding pad 3. $r_2$ represents the inner radius of the region 5.

Herein, the parasitic capacitance $C_p$ and the parasitic resistance $R_p$ are calculated using an "area division model". It is assumed that the bonding pad 3 has a plurality of areas $D_1$ through $D_k$ divided concentrically. The region 4 has a plurality of areas $D'_1$ through $D'_k$ corresponding thereto, respectively. Areas $D'_1$ through $D'_k$ do not exist in a part corresponding to the fan-shaped area 11 having the central angle $\theta_1$.

FIG. 9B shows the fan-shaped area 11 having the central angle $\theta_1$. It is assumed that the fan-shaped area 11 has a plurality of areas $F'_1$ through $F'_k$ divided concentrically, and that each of the plurality of areas $F'_1$ through $F'_k$ has 2 m pieces of blocks. Among the 2 m pieces of blocks included in area $F'_{k-n}$, m pieces of block corresponding to the central angle $\theta_1/2$ are defined as blocks $FF'_{j,k-n}$. Herein, j is an integer of 1 or more and m or less. $m=\theta_1/2\theta$.

FIG. 9C three-dimensionally shows an equivalent circuit regarding them pieces of blocks $FF'_{1,k-n}$ through $FF'_{mk-n}$ included in area $F'_{k-n}$. In FIG. 9C, Ca(j, k-n) represents a capacitance existing between area $D_{k-n}$ of the bonding pad 3 and block $FF'_{j, k-n}$ of the semiconductor substrate 1. rsh represents a resistance of block $FF'_{j, k-n}$. The resistance rsh is equal to the sheet resistance $\rho$ of the semiconductor substrate 1. Herein, j is an integer of 1 or more and m or less.

Figure 9D:
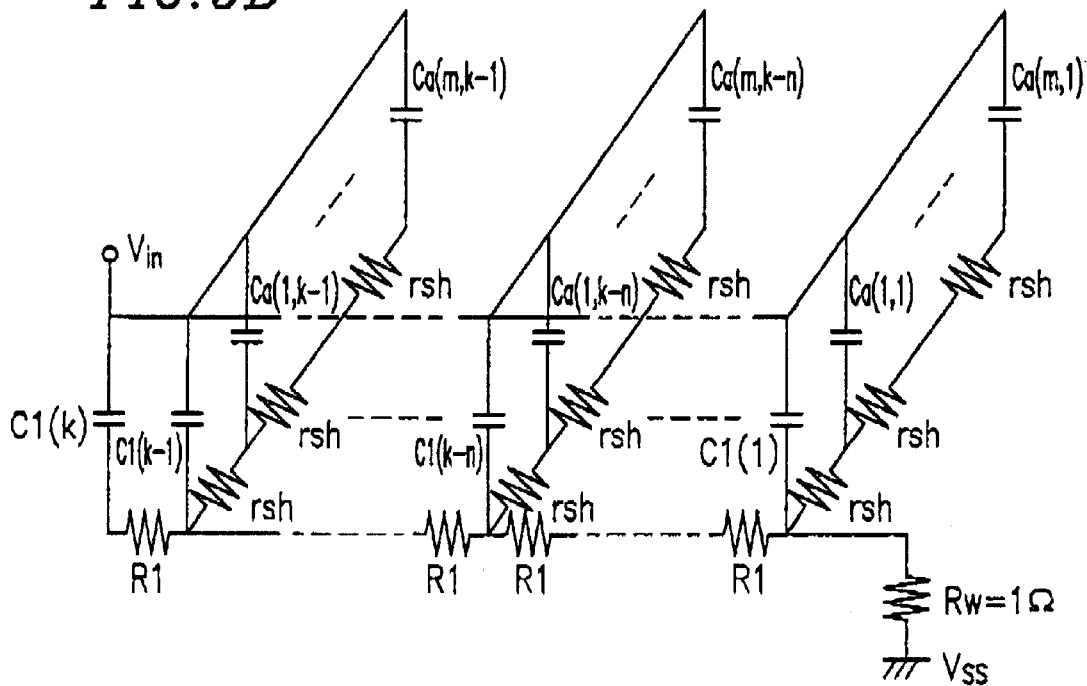

FIG. 9D shows an equivalent circuit of the semiconductor integrated circuit 10 shown in FIG. 9A. In FIG. 9D, C1(k-n) represents a capacitance existing between area $D_{k-n}$ of the bonding pad 3 and area $D'_{k-n}$ of the semiconductor substrate 1. R1 represents a resistance existing between an outer periphery and an inner periphery of area $D'_{k-n}$ of the semiconductor substrate 1. Herein, n is an integer of 0 or more and k-1 or less. $R_w$ represents a resistance existing between the region 5 and the voltage supply section 6 for supplying the prescribed voltage potential $V_{ss}$.

Figure 9E:
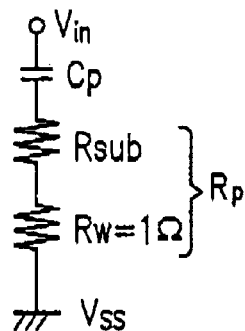

FIG. 9E shows a simplified equivalent circuit of the semiconductor integrated circuit 10. The semiconductor integrated circuit 10 is equivalent to a circuit including a parasitic capacitance $C_p$ and a parasitic resistance $R_p$ connected in series. The parasitic capacitance $C_p$ is obtained by synthesizing k pieces of capacitances C1(1) through C1(k) and mk pieces of capacitances Ca(1, 1) through Ca(m, k-1). The parasitic resistance $R_p$ is equivalent to a circuit including a substrate resistance $R_{sub}$ and a resistance $R_w$ connected in series. The substrate resistance $R_{sub}$ can be obtained by synthesizing k pieces of resistances R1 and mk pieces of resistances rsh.

The resistance R1 is calculated in accordance with expression (13).

$$R1=\rho\times\theta/(2\pi-\theta_1) \quad \text{expression (13)}$$

The capacitance C1(k-n) is calculated in accordance with expression (14).

$$C1(k-n)=cap\times\pi\times r_1^2(1-\theta)^{2k-2n-2}\theta(2-\theta)\times(2\pi-\theta_1)/\theta \quad \text{expression (14)}$$

The capacitance Ca(j, k-n) is calculated in accordance with expression (15).

$$Ca(j, k-n)=2\times cap\times\pi\times r_1^2(1-\theta)^{2k-2n-2}\theta(2-\theta) \quad \text{expression (15)}$$

Herein, cap represents a capacitance per a unit area. Herein, it is assumed that $cap\times\pi\times r_1^2=1$ pF in order to simplify the calculation.

Figure 10:
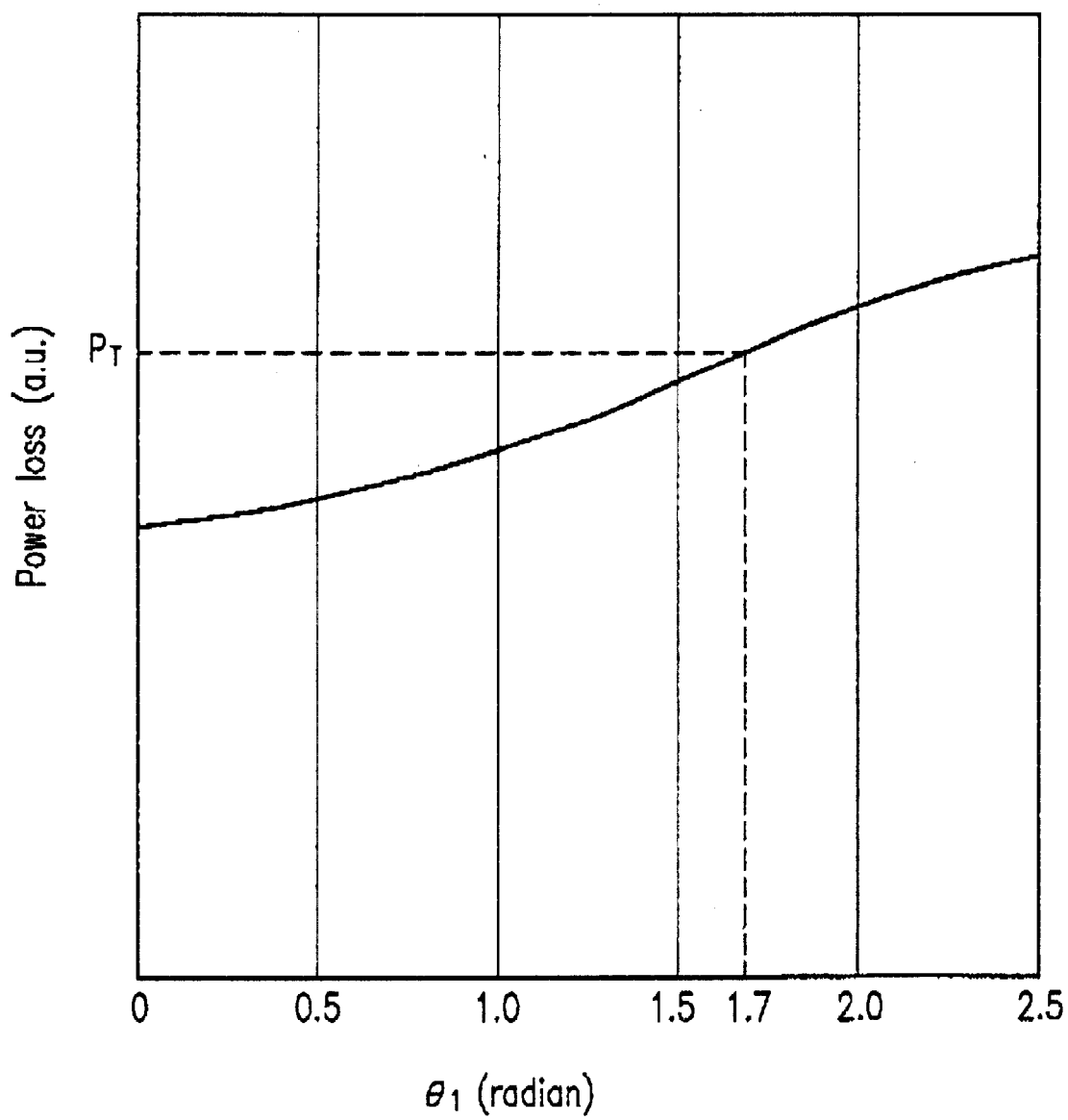
FIG. 10 is a graph showing the relationship between the central angle $\theta_1$ of a fan-shaped area 11 and the power loss.

FIG. 10 shows the results of simulation based on the equivalent circuit shown in FIG. 9D. The conditions for simulation are $r_1=r_2=100$ μm, f=1 GHz and $\rho=1000$ Ω. In FIG. 10, the horizontal axis indicates the value of the central angle $\theta_1$, and the vertical axis indicates the power loss of the semiconductor integrated circuit 10. It is understood from FIG. 10 that the power loss can be reduced even when there is a part of the region 4 which is not surrounded by the region 5 as long as the part is sufficiently small. For example, in order to make the power loss of the semiconductor integrated circuit 10 to a tolerable value $P_\gamma$ (for example, 2.0 mW) or less, the central angle $\theta_1$ is set so as to fulfill $\theta_1 \leq 1.7$ radian. Thus, by substantially surrounding the region 4 by the region 5, the power loss of the semiconductor integrated circuit 10 can be reduced.

In this specification, the expression "the region 5 substantially surrounds the region 4" is defined to include a structure where "the region 5 completely surrounds the region 4" and a structure where "there is a part of the region 4 which is not surrounded by the region 5 on condition that the power loss is a tolerable value or less".

It is not necessary that the entirety of the region 5 be set to a prescribed voltage potential. At least a part of the region 5 can be set to a different voltage potential from the prescribed voltage potential as long as a similar effect is obtained to the case where the entirety of the region 5 is set to the prescribed voltage potential. For example, when a plurality of contact portions are discretely arranged on the region 5 and are connected to the voltage supply section 6 for supplying a prescribed voltage potential $V_{ss}$, the portions of the region 5 which are in contact with the contact portions are set to the prescribed voltage potential $V_{ss}$, but the other portions are not precisely set to the prescribed voltage potential $V_{ss}$. However, the entirety of the region 5 can be regarded as substantially set to the prescribed voltage potential $V_{ss}$ where the plurality of contact portions are arranged on the region 5 so that a distance between every two adjacent contact portions is sufficiently small. Accordingly, when a plurality of contact portions are used to set the region 5 to a prescribed voltage potential $V_{ss}$, the number of contact portions is preferably as large as possible.

Hereinafter, specific examples according to the invention will be described.

EXAMPLE 1

Figure 11A:
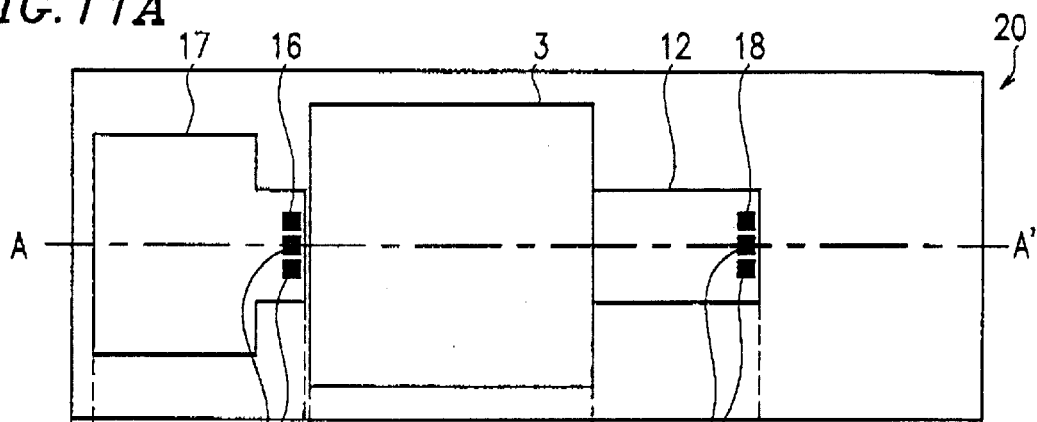
FIGS. 11A through 11E are views showing a structure of a semiconductor integrated circuit 20 in a first example according to the present invention.
Figure 11B:
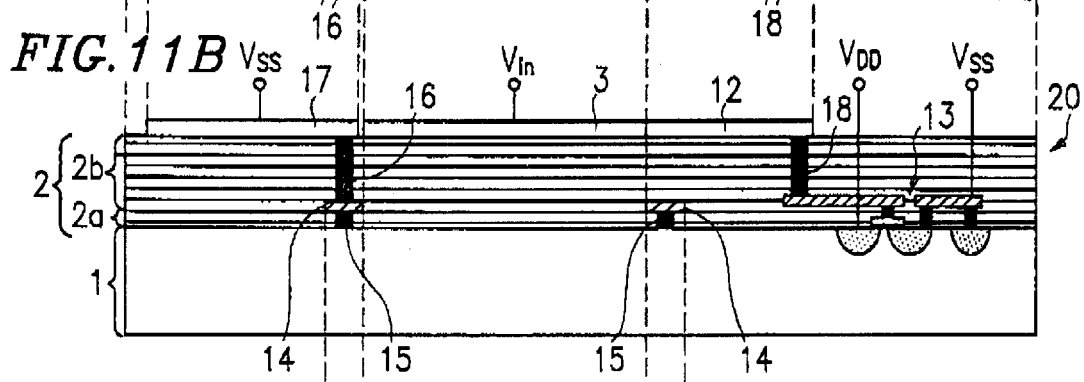

FIG. 11A is a plan view of a semiconductor integrated circuit 20 in a first example according to the present invention. FIG. 11B is a cross-sectional view of the semiconductor integrated circuit 20 taken along line A–A' shown in FIG. 11A.

The semiconductor integrated circuit 20 includes a semiconductor substrate 1, an insulating layer 2 formed on the semiconductor substrate 1, and a bonding pad 3 formed on the insulating layer 2. The bonding pad 3 is connected to another circuit through an interconnect 12. Accordingly, a signal input to the bonding pad 3 is transmitted to the another circuit through the interconnect 12. In FIG. 11B, a MOS transistor 13 is shown as an example of the circuit connected to the bonding pad 3.

The semiconductor integrated circuit 20 further includes a conductive layer 14 and a plurality of contact holes 15 discretely formed. The conductive layer 14 is formed in the insulating layer 2. The conductive layer 14 is connected to a bonding pad 17 through a contact hole 16. The bonding pad 17 is connected to a voltage supply section 6 (FIG. 1) for supplying a prescribed voltage potential $V_{ss}$. The voltage supply section 6 can be, for example, a terminal set to a prescribed voltage potential $V_{ss}$. The plurality of contact holes 15 each electrically connect the conductive layer 14 and the semiconductor substrate 1 to each other.

Figure 11C:
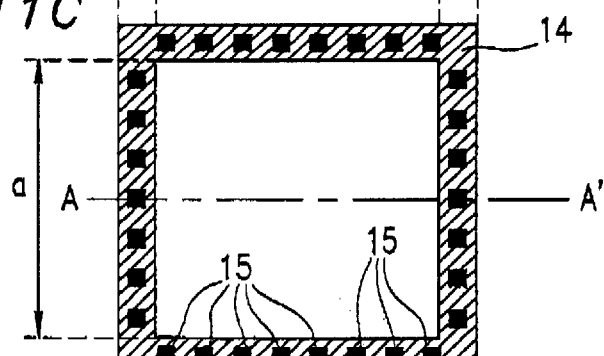

FIG. 11C is a plan view showing the shape of the conductive layer 14. In the example shown in FIG. 11C, the conductive layer 14 is frame-shaped and located outside a region 4 on the semiconductor substrate 1 facing the bonding pad 3. In FIG. 11C, black squares indicate positions of the contact holes 15. In FIG. 11C, line A–A' correspond to the line A–A' shown in FIG. 11A.

Thus, the bonding pad 3 and the conductive layer 14 are preferably located so as not to face each other. The reason for this is that when the bonding pad 3 and the conductive layer 14 face each other, a parasitic capacitance $C_p$ existing between the bonding pad 3 and the conductive layer 14 increases. The increase in the parasitic capacitance $C_p$ causes an increase in the power loss of the semiconductor integrated circuit 20.

The bonding pad 3 and the conductive layer 14 are preferably located so as not to face each other also from the viewpoint of reliability of the semiconductor integrated circuit 20. The reason for this is that when the bonding pad 3 and the conductive layer 14 face each other, the bonding pad 3 and the conductive layer 14 may be undesirably shortcircuited by a large force applied to the bonding pad 3 at the time of bonding. When the bonding pad 3 and the conductive layer 14 are located so as not to face each other, there is no undesirable possibility of shortcircuiting between the bonding pad 3 and the conductive layer 14.

Figure 11D:
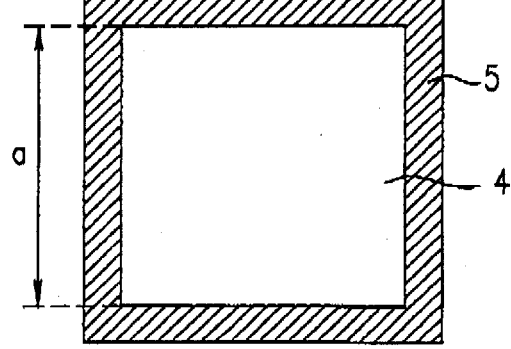

FIG. 11D is a plan view showing the shape of a region 5 of the semiconductor substrate 1 immediately below the conductive layer 14. As shown in FIG. 11D, the shape of the region 5 is identical with the shape of the conductive layer 14. As can be appreciated, the shape of the region 5 is determined by the shape of the conductive layer 14.

The region 5 surrounds the region 4 facing the bonding pad 3. The voltage potential of the region 5 is set to the prescribed voltage potential $V_{ss}$ since the region 5 is connected to the voltage supply section 6 for supplying the prescribed voltage potential $V_{ss}$ through the contact holes 15, the conductive layer 14, the contact hole 16 and the bonding pad 17. The number of the contact holes 15 is preferably as large as possible since where the number of the contact holes 15 is sufficiently large, the entirety of the region 5 can be regarded as set to the prescribed voltage potential $V_{ss}$, not only the portions of the region 5 which are in contact with the contact holes 15.

Figure 11E:
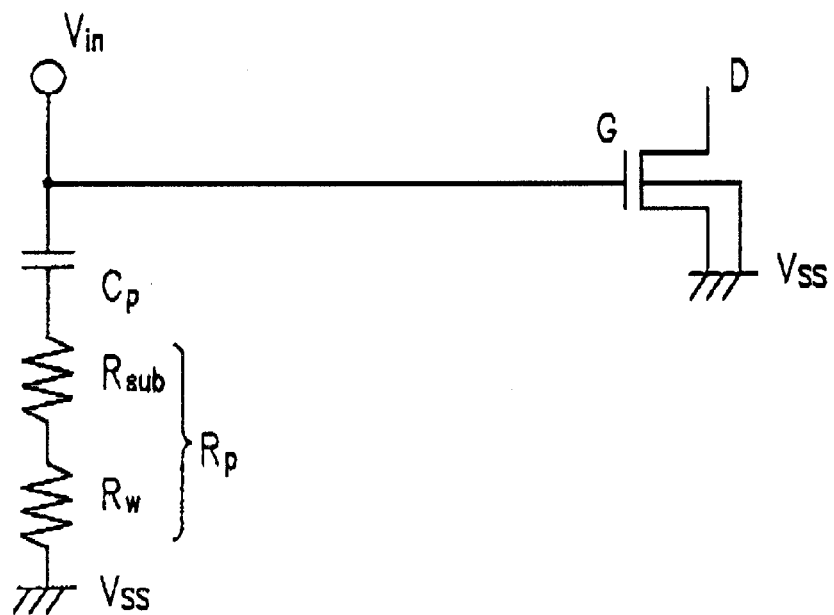

FIG. 11E shows an equivalent circuit of the semiconductor integrated circuit 20. In FIG. 11E, $C_p$ represents a parasitic capacitance existing between the bonding pad 3 and the semiconductor substrate 1. $R_p$ represents a parasitic resistance existing between the bonding pad 3 and the voltage supply section 6. The parasitic resistance $R_p$ is equivalent to a circuit including a substrate resistance $R_{sub}$ and a resistance $R_w$ connected in series. Herein, the resistance $R_w$ is a resistance existing between the region 5 and the voltage supply section 6 for supplying the prescribed voltage potential $V_{ss}$.

Thus, by setting the region 5 surrounding the region 4 facing the bonding pad 3 substantially at an equipotential, the parasitic resistance $R_p$ can be reduced without substantially increasing the parasitic capacitance $C_p$ based on the above-described principle of the present invention. As a result, the power loss of the semiconductor integrated circuit 20 is reduced and the noise generation is suppressed.

The power loss caused by a parasitic element in the is interconnect 12 can be reduced by forming the region 5 so as to substantially surround an area of the semiconductor substrate 1 facing the interconnect 12 as well as the region 4 facing the bonding pad 3. The reason for this in that the basic principle described regarding the bonding pad 3 can be applied to the interconnect 12. Due to such a structure, the entire power loss of the semiconductor integrated circuit 20 can further be reduced.

Figure 12:
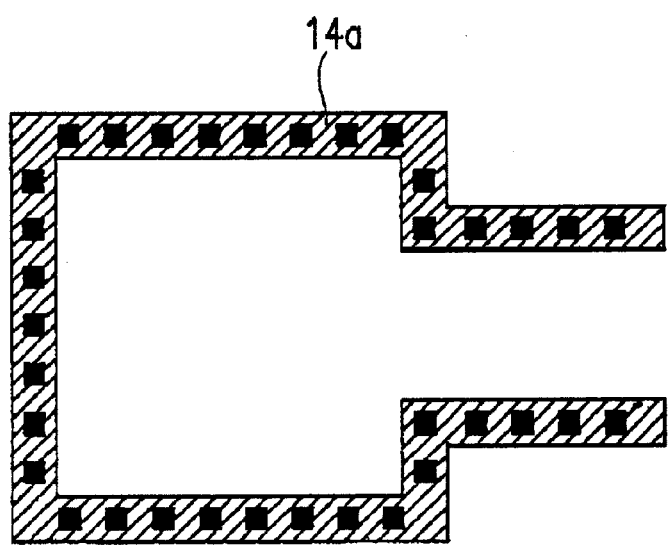

FIG. 12 is a plan view showing the shape of a conductive layer 14a formed in consideration of the interconnect 12. The conductive layer 14a does not completely surround the region 4. Nonetheless, as described with reference to FIG. 10, when the part of the region 4 which is not surrounded by the region 5 is sufficiently small, a similar affect to the above-described effect is obtained. The width of the interconnect 12 can be equal to the length of a side of the bonding pad 3. In this case also, the conductive layer 14a can be formed so as to match the shape of the interconnect 12 and the bonding pad 3.

Hereinafter, preferable properties of the semiconductor substrate 1, the insulating layer 2, the bonding pad 3 and the conductive layer 14 will be described.

The semiconductor substrate 1 can be, for example, a p-type silicon substrate. However, the polarity of the semiconductor substrate 1 is not essential to the present invention. The semiconductor substrate 1 can be an n-type silicon substrate. A material of the insulating layer 2 is preferably $SiO_2$ or the like. The thickness of the insulating layer 2 is preferably about 1 $\mu$m to 2 $\mu$m. The bonding pad 3 is preferably a square having a side of about 100 $\mu$m. As the material of the bonding pad 3, a metal material having a low conductivity is usable. The material of the bonding pad 3 is preferably aluminum, gold or copper. The material of the conductive layer 14 is preferably aluminum, gold or copper.

Hereinafter, a method for fabricating the semiconductor integrated circuit 20 will be described. On the semiconductor substrate 1, an insulating layer 2a (FIG. 11B) is formed as a first insulating layer. In the insulating film 2a, the contact holes 15 are formed so as to be electrically connected to the semiconductor substrate 1. Then, the conductive layer 14 as a first conductive layer is formed on the insulating film 2a. The conductive layer 14 is electrically connected to the contact holes 15. On the conductive layer 14, an insulating layer 2b (FIG. 11B) is formed as a second insulating layer. In the insulating layer 2b, contact holes 16 are formed so as to be electrically connected to the conductive layer 14, and contact holes 18 are formed so as to be electrically connected to the MOS transistor 13. Then, the bonding pad 3 and 17 and the interconnect 12 are formed as a second conductive layer on the insulating layer 2b. The bonding pad 17 is electrically connected to the contact holes 16. The bonding pad 3 and the interconnect 12 are electrically connected to each other.

A method for fabricating the MOS transistor 13 will not be described in detail. The MOS transistor 13 is fabricated by a well-known method. In the above, the method for fabricating the semiconductor integrated circuit 20 has been described mainly regarding a method for fabricating the pad structure in the semiconductor integrated circuit 20.

As can be appreciated, the semiconductor integrated circuit 20 does not require any additional fabrication step to a usual method for fabricating the MOS transistor. Accordingly, no new process is needed to be developed to fabricate the semiconductor integrated circuit 20. This is effective to reduce the fabrication cost of the semiconductor integrated circuit 20. Such a fabrication method does not significantly increase the layout area for the semiconductor integrated circuit 20.

EXAMPLE 2

Figure 13A:
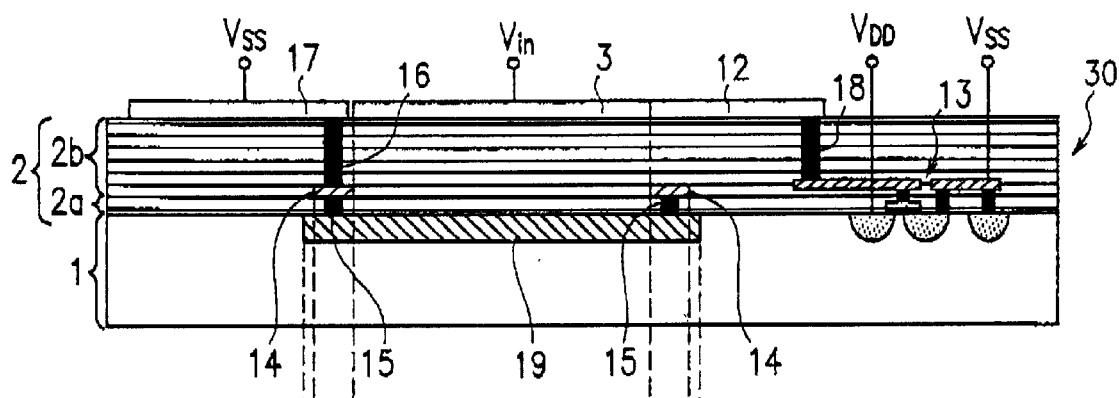
FIGS. 13A through 13C are views showing a structure of a semiconductor integrated circuit 30 in a second example according to the present invention.

FIG. 13A is a cross-sectional view of a semiconductor integrated circuit 30 in a second example according to the present invention. In FIG. 13A, identical elements with those shown in FIGS. 11A through 11E bear identical reference numerals, and detailed descriptions thereof will be omitted.

Figure 13B:
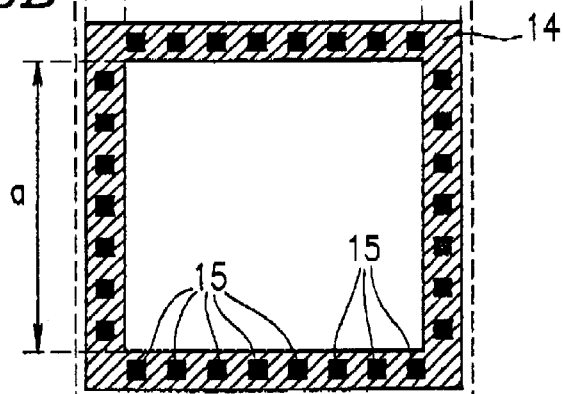

FIG. 13B is a plan view showing the shape of the conductive layer 14. In the example shown in FIG. 13B, the conductive layer 14 is frame-shaped and located outside the region 4 on the semiconductor substrate 1 facing the bonding pad 3. In FIG. 13B, black squares indicate positions of the contact holes 15.

Figure 13C:
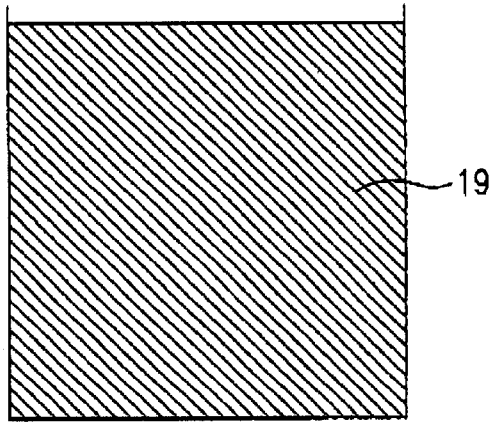

FIG. 13C is a plan view showing the shape of a low resistance layer 19 formed in the semiconductor substrate 1.

By forming the low resistance layer 19 in the semiconductor substrate 1 as shown in FIGS. 13A and 13C, the parasitic resistance $R_p$ can further be reduced. The reason for this is that formation of the low resistance layer 19 in the semiconductor substrate 1 provides a similar effect to reduction of the sheet resistance of the semiconductor substrate 1. Herein, the low resistance layer 19 is defined as a layer having a sheet resistance which is smaller than the sheet resistance of the semiconductor substrate 1 by one or more orders of magnitude.

The low resistance layer 19 can be formed of, for example, a material doped with impurities having the same polarity as that of the semiconductor substrate 1. Alternatively, the low resistance layer 19 can be formed of a material doped with impurities having the opposite polarity to that of the semiconductor substrate 1. Still alternatively, the low resistance layer 19 can be formed of an epitaxial layer.

The low resistance layer 19 does not need to be formed at the entire face of the semiconductor substrate 1. The effect of reducing the parasitic resistance $R_p$ is obtained by forming the low resistance layer 19 in at least a part of the region 4 of the semiconductor substrate 1 facing the bonding pad 3. The reason for this is that reduction in the sheet resistance of a part of the semiconductor substrate 1 immediately below the bonding pad 3 contributes to the reduction in the parasitic resistance $R_p$. In order to enhance the effect of reducing the parasitic resistance $R_p$, the low resistance layer 19 is preferably formed so as to cover the region 4 of the semiconductor substrate 1.

EXAMPLE 3

In the above-described first and second examples, the conductive layer 14 is frame-shaped. The conductive layer 14 is not limited to such a shape. For example, the conductive layer 14 can have a plurality of basic cells arranged in an array. The basic cells can be of an arbitrary polygon or circle. For example, the basic cells can be square, rectangular or hexagonal.

Figure 14A:
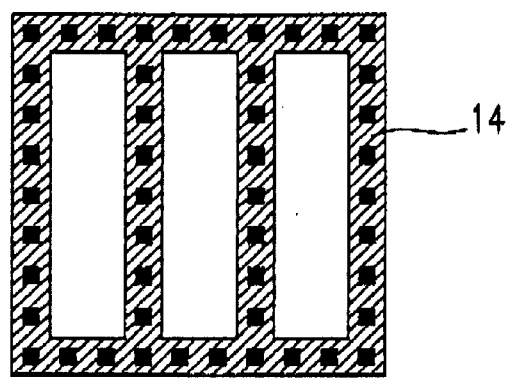
FIGS. 14A through 14C are views showing a conductive layer 14 having a plurality of basic cells arranged in an array.
Figure 14B:
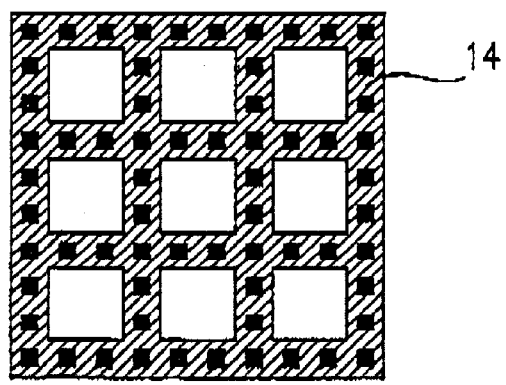
Figure 14C:
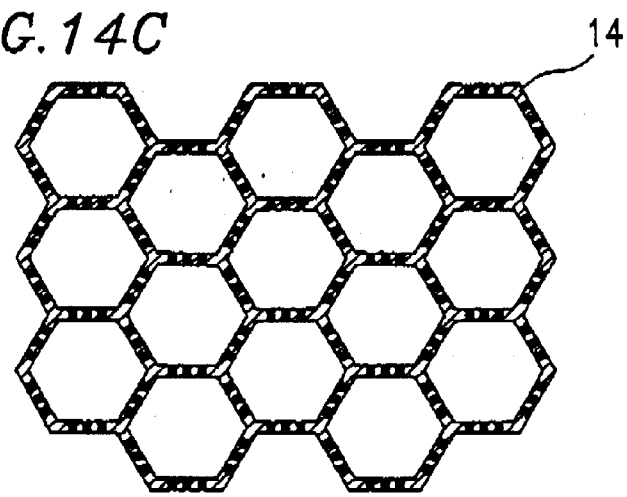

FIGS. 14A, 14B and 14C show examples of the conductive layer 14 having a plurality of basic cells arranged in an array. In FIG. 14A, rectangular basic cells are arranged in lattice. In FIG. 14B, square basic cells are arranged in mesh. In FIG. 14C, hexagonal basic cells are arranged in a honeycomb manner.

The value of the parasitic resistance $R_p$ can be controlled in accordance with the number of basic cells arranged on the region 4 of the semiconductor substrate 1 facing the bonding pad 3. For example, the parasitic resistance $R_p$ can be reduced to about 1 Ω by arranging 16 hexagonal basic cells in a honeycomb manner as shown in FIG. 14C on the region 4 of the semiconductor substrate 1. As a result, the power loss is reduced to about 1/70. The deterioration by noise can be reduced to a substantially negligible level.

When 100 hexagonal the basic cells are arranged in a honeycomb manner as shown in FIG. 14C, the parasitic resistance $R_p$ can be reduced to about 1 Ω when evaluated under the conditions of f=1 GHz and ρ=1000 Ω. As a result, the power loss is reduced to about 1/50. The deterioration by noise can be reduced to a substantially negligible level.

Figure 15A:
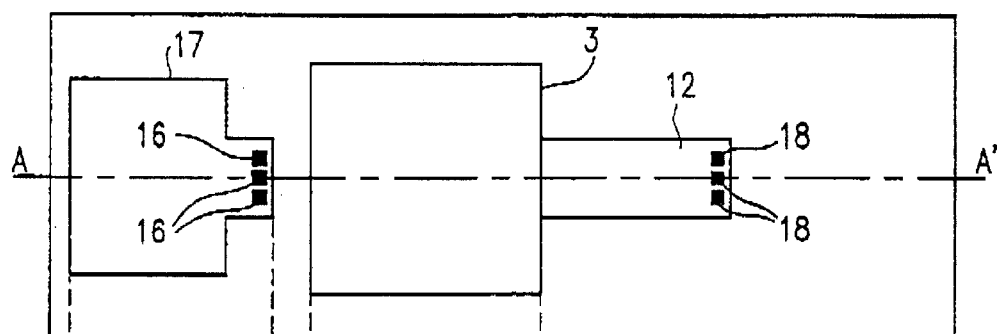
FIGS. 15A through 15D are views showing a structure of a semiconductor integrated circuit 40 in a third example according to the present invention.
Figure 15B:
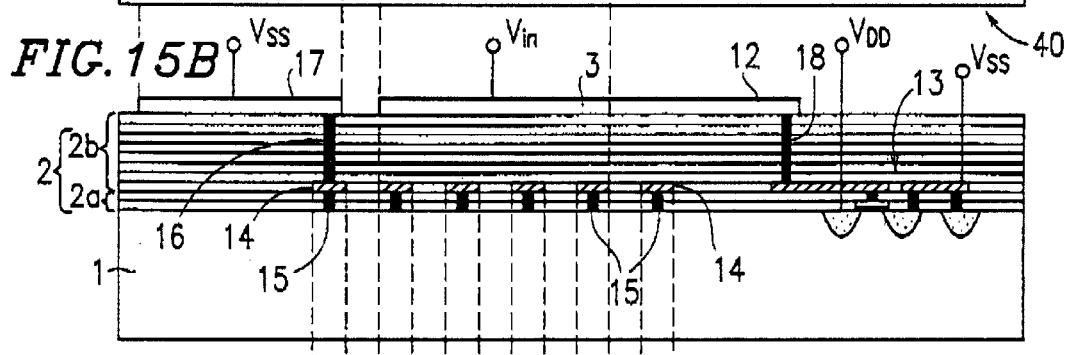

FIG. 15A is a plan view of a semiconductor integrated circuit 40 including the conductive layer 14 formed of a mesh layer. FIG. 15B is a cross-sectional view of the semiconductor integrated circuit 40 taken along line A–A' shown in FIG. 15A. In FIGS. 15A and 15B, identical elements with those shown in FIGS. 11A through 11E bear identical reference numerals and detailed descriptions thereof will be omitted.

Figure 15C:
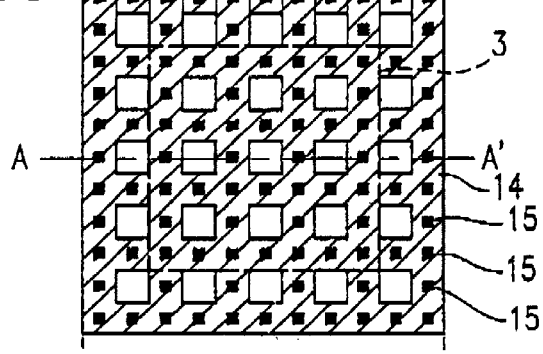

FIG. 15C is a plan view showing the shape of the conductive layer 14. In FIG. 15C, black squares indicate positions of the contact holes 15. In FIG. 15C, line A–A' correspond to the line A–A' shown in FIG. 15A.

Figure 15D:
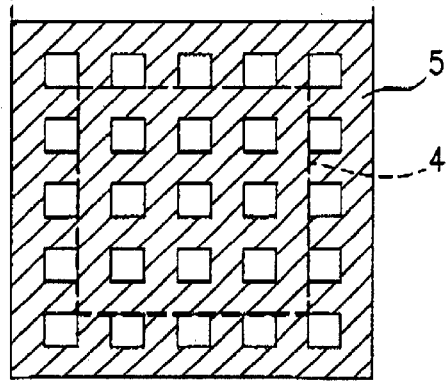

FIG. 15D is a plan view showing the shape of a region 5 of the semiconductor substrate 1 immediately below the conductive layer 14. As shown in FIG. 15D, the region 5 surrounds a part of the region 4 facing the bonding pad 3. The voltage potential of the region 5 is set to a prescribed voltage potential $V_{ss}$.

Thus, by setting the region 5 surrounding at least a part of the region 4 facing the bonding pad 3 substantially at an equipotential, the parasitic resistance $R_p$ can be reduced without substantially increasing the parasitic capacitance $C_p$ based on the above-described principle of the present invention. As a result, the power loss of the semiconductor integrated circuit 40 is reduced and the noise generation is suppressed.

The parasitic resistance $R_p$ can further be reduced by combining the conductive layer having a plurality of basic cells arranged in an array and the low resistance layer described in the second example 2.

EXAMPLE 4

In the above-described first through third examples, the shape and the position of the region 5 are defined using the conductive layer 14 and the contact holes 15. It is not indispensable to use the conductive layer 14. A prescribed voltage potential $V_{ss}$ can be supplied to the region 5 without using the conductive layer 14.

The contact holes 15 do not need to be discretely formed. It is rather preferable that the contact holes 15 are formed continuously in order to uniformly set the region 5 to a prescribed voltage potential $V_{ss}$.

Figure 16A:
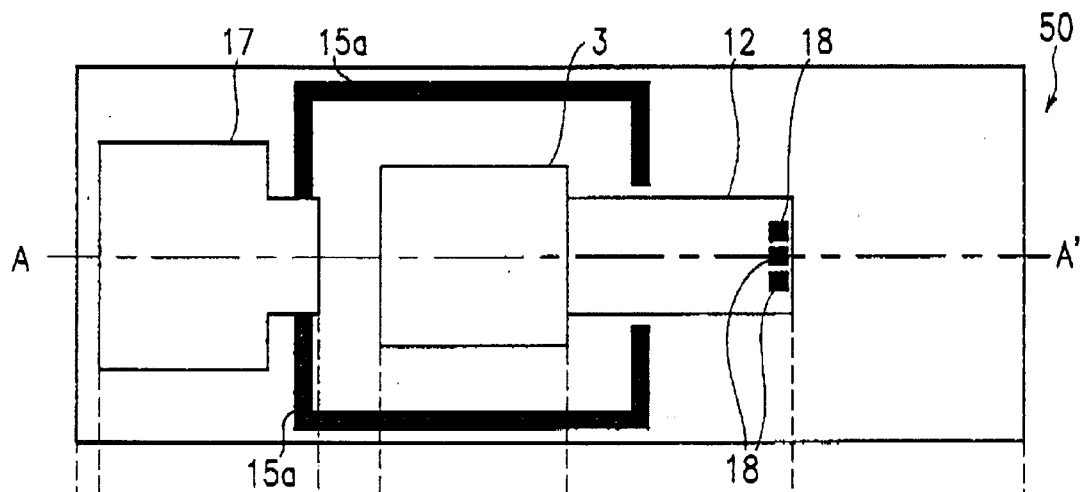
FIGS. 16A through 16C are views showing a structure of a semiconductor integrated circuit 50 in a fourth example according to the present invention.
Figure 16B:
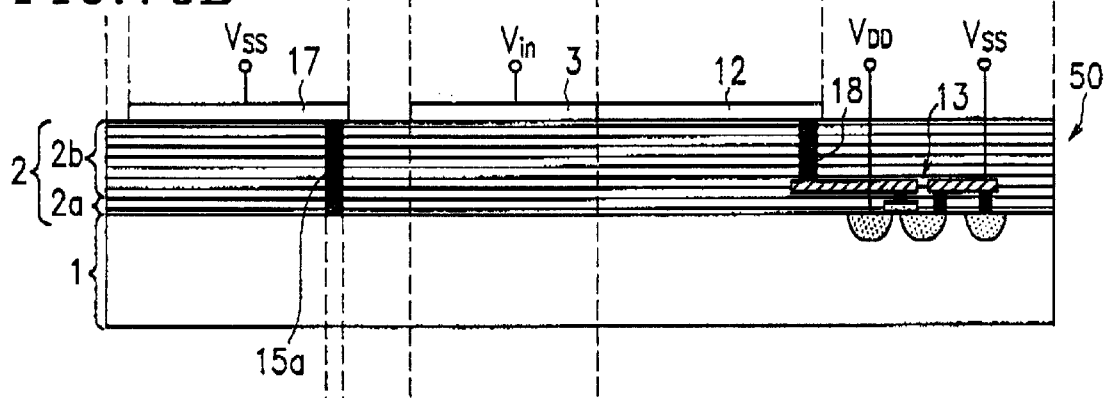

FIG. 16A is a plan view of a semiconductor integrated circuit 50 in which the region 5 of the semiconductor substrate 1 is set to a prescribed voltage potential $V_{ss}$ using a contact portion 15a continuously formed, without using the conductive layer 14. FIG. 16B is a cross-sectional view of the semiconductor integrated circuit 50 taken along line A–A' shown in FIG. 16A. In FIGS. 16A and 16B, identical elements with those shown in FIGS. 11A through 11E bear identical reference numerals and detailed descriptions thereof will be omitted.

The contact portion 15a is continuously formed so as to surround the region 4 of the semiconductor substrate 1 facing the bonding pad 3. A part of the contact portion 15a is connected to the bonding pad 17 which is set to the prescribed voltage potential $V_{ss}$.

Figure 16C:
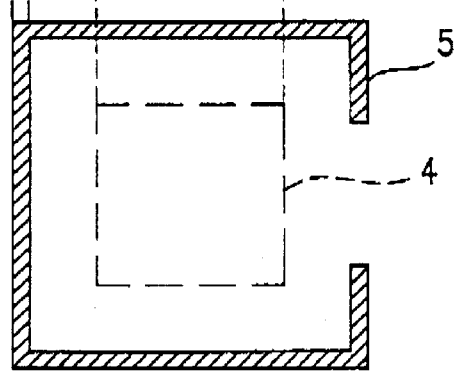

FIG. 16C is a plan view showing the shape of the region 5 of the semiconductor substrate 1 which is set to the prescribed voltage potential $V_{ss}$. The shape of the region 5 is defined by a part where the contact portion 15a contacts the semiconductor substrate 1. Thus, the region 5 set to the prescribed voltage potential $V_{ss}$ can be defined around the region 4 using only the contact portion 15a without using the conductive layer 14. The part where the contact portion 15a contacts the semiconductor substrate 1 can be formed continuously by using the continuously formed contact portion 15a. Thus, the voltage potential of the region 5 can be set to the prescribed voltage potential $V_{ss}$ more uniformly than the case where the region 5 is set to the prescribed voltage potential $V_{ss}$ using the plurality of contact holes 15 discretely formed.

Thus, by setting the region 5 surrounding at least a part of the region 4 facing the bonding pad 3 substantially at an equipotential, the parasitic resistance $R_p$ can be reduced without substantially increasing the parasitic capacitance $C_p$ based on the above-described principle of the present invention. As a result, the power loss of the semiconductor integrated circuit 50 is reduced and the noise generation is suppressed.

The parasitic resistance $R_p$ can further be reduced by combining the contact portion 15a continuously formed and the low resistance layer described in the second example 2.

EXAMPLE 5

FIG. 17A is a plan view of a semiconductor integrated circuit 60 in a fifth example according to the present invention. FIG. 17B is a cross-sectional view of the semiconductor integrated circuit 60 taken along line A–A' shown in FIG. 17A. In FIGS. 17A and 17B, identical elements with those shown in FIGS. 11A through 11E bear identical reference numerals and detailed descriptions thereof will be omitted.

A metal layer 61 is formed on a part of a surface of the semiconductor substrate 1 facing the bonding pad 3. The metal layer 61 is connected to the bonding pad 17 set to a prescribed voltage potential $V_{ss}$ through contact holes 16. The metal layer 61 is formed so as to substantially surround the region 4 of the semiconductor substrate 1 facing the bonding pad 3. Thus, the region 5 substantially surrounding the region 4 of the semiconductor substrate 1 is set to the prescribed voltage potential $V_{ss}$.

FIG. 17C is a plan view showing the shape of the metal layer 61. In the example show in FIG. 17C, the metal layer 61 is frame-shaped and is located outside the region 4 of the semiconductor substrate 1 facing the bonding pad 3. In FIG. 17C, black squares indicate positions of the contact holes 16. In FIG. 17C, line A–A' correspond to the line A–A' shown in FIG. 17A.

FIG. 17D is a plan view showing the shape of the region 5 of the semiconductor substrate 1 in contact with the metal layer 61. As shown in FIG. 17D, the shape of the region 5 is identical with the shape of the metal layer 61.

In lieu of the frame-shaped metal layer 61 shown in FIG. 17C, a metal layer 62 having the shape of a flat plate can be used.

Figure 17E:
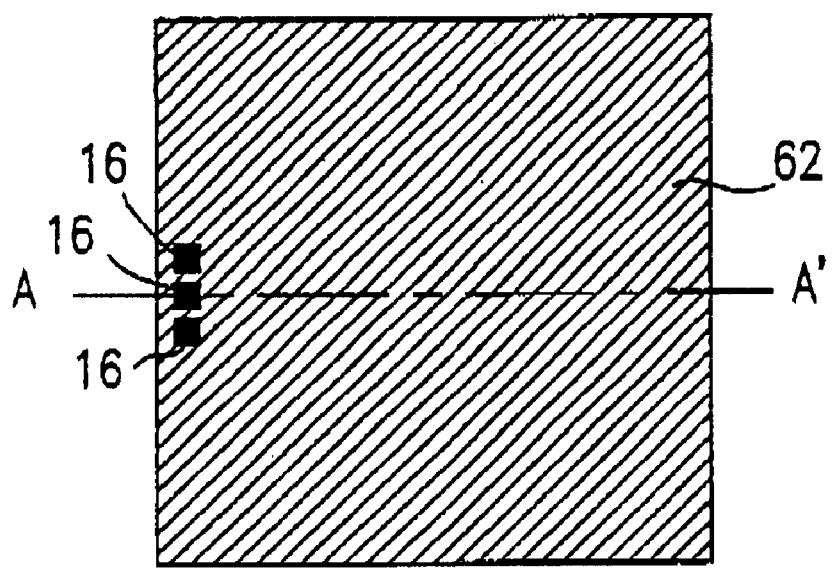

FIG. 17E is a plan view showing the shape of the metal layer 62. In the example shown in FIG. 17E, the metal layer 62 is arranged so as to cover the region 4 of the semiconductor substrate 1 facing the bonding pad 3. In FIG. 17E, black squares indicate positions of the contact holes 16. In FIG. 17E, line A–A' correspond to the line A–A' shown in FIG. 17A.

When the metal layer 62 is formed on the semiconductor substrate 1, the region 4 is set to the prescribed voltage potential $V_{ss}$ in addition to the region 5 substantially surrounding the region 4 since a part of the semiconductor substrate 1 in contact with the metal layer 62 includes the region 4. A structure in which the voltage potential of the region 4 is set to the prescribed voltage potential $V_{ss}$ is included in the scope of the present invention as long as the voltage potential of the region 5 is set to the prescribed voltage potential $V_{ss}$. Thus, a structure in which the voltage potential of the region 4 is set to the prescribed voltage potential $V_{ss}$ and a structure in which the voltage potential of the region 4 is not set to the prescribed voltage potential $V_{ss}$ are both included in the scope of the present invention as long as the voltage potential of the region 5 is set to the prescribed voltage potential $V_{ss}$.

Preferable materials for the metal layers 61 and 62 include aluminum, gold and copper.

Thus, by setting the region 5 surrounding at least a part of the region 4 facing the bonding pad 3 substantially at an equipotential, the parasitic resistance $R_p$ can be reduced without substantially increasing the parasitic capacitance $C_p$ based on the above-described principle of the present invention. As a result, the power loss of the semiconductor integrated circuit 60 is reduced and the noise generation is suppressed.

The parasitic resistance $R_p$ can further be reduced by combining the metal layer 61 or 62 and the low resistance layer described in the second example 2.

EXAMPLE 6

Figure 18:
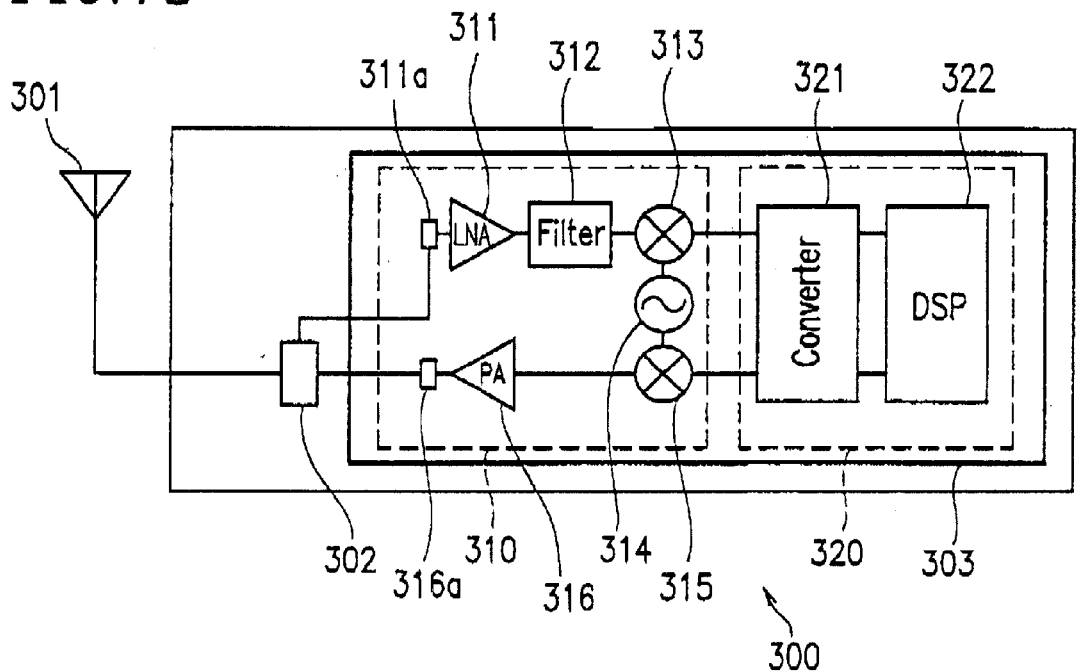
FIG. 18 is a view showing a structure of a communication system 300 in a sixth example according to the present invention.

FIG. 18 shows a communication system 300 in a sixth example according to the present invention. The communication system 300 includes an RF section 310 for transmitting or receiving a signal, and a baseband signal processing section 320 for processing a signal to be transmitted or a signal received. The RF section 310 and the baseband signal processing section 320 are provided on a single semiconductor chip 303. The semiconductor chip 303 is preferably a silicon substrate since the silicon substrate is suitable for formation of a CMOS.

An antenna 301 receives a signal having a high frequency. The signal has a frequency of, for example, 100 MHz or more. The signal received by the antenna 301 is input to a low noise amplifier (LNA) 311 of the RF section 310 through a transmitting/receiving switch 302. The LNA 311 amplifies the received signal. The amplified signal is input to a mixer 313 through a filter 312. The mixer 313 mixes the signal output from the filter 312 and an oscillation signal output from an oscillator 314. The output from the mixer 313 is supplied to the baseband signal processing signal 320.

The baseband signal processing section 320 includes a converter 321 and a digital signal processor (DSP) 322. The converter 321 converts the analog signal output from the mixer 313 into a digital signal. The DSP 322 processes the digital signal.

The digital signal processed by the DSP 322 is converted into an analog signal by the converter 321. A mixer 315 of the RF section 310 mixes the signal output from the converter 321 and an oscillation signal output from the oscillator 314. A power amplifier (PA) 316 amplifies the output from the mixer 315. The amplified signal is transmitted from the antenna 301 through the transmitting/receiving switch 302.

The RF section 310 includes a pad structure 311a used for inputting a signal to the LNA 311 and a pad structure 316a used for outputting a signal from the PA 316. The pad structure 311a and the pad structure 316a each can have any structure of the semiconductor integrated circuits according to the present invention described with reference to FIGS. 1 through 17. The pad structure 311a allows the power loss and noise generation caused when a signal is input to the LNA 311 to be reduced. The pad structure 316a allows the power loss and noise generation caused when a signal is output from the PA 316 to be reduced.

The communication system 300 can both transmit and receive a signal. Alternatively, the communication system 300 can be only for transmitting a signal or only for receiving a signal.

As described above, the pad structure 311a is used for inputting a signal received by the antenna 301 to another signal circuit (e.g., LNA 311). The pad structure 311a is not limited to such a use. The pad structure 316a is used for outputting a signal to be transmitted from another circuit (e.g., PA 316) through the antenna 301. The pad structure 316a is not limited to such a use. For example, in an embodiment in which the pad structure 311a is provided on a first semiconductor chip and the pad structure 316a is provided on a second semiconductor chip which is different from the first semiconductor chip, the pad structures 311a and 316a can be used for communicating a signal through an interface between the first semiconductor chip and the second semiconductor chip (e.g., a bus connecting the first semiconductor chip and the second semiconductor chip). Especially when the interface is a high speed interface, the structure according to the present invention is suitable for the pad structures 311a and 316a.

Hereinafter, an effect of the present invention of reducing power loss will be specifically described in comparison with the conventional art.

Table 1 summarizes the effect of the present invention of reducing power loss. In Table 1, "$C_p$" in column 1 represents a value of the parasitic capacitance $C_p$, "$R_p$" in column 2 represents a value of the parasitic resistance $R_p$, and "power loss" in column 3 represents a value of the power consumed by the semiconductor integrated circuit. The "power loss" is represented by a relative value with respect to the power lose of conventional art example 1 which is set as 1 (reference value).

TABLE 1

|  | $C_p$ (pF) | $R_p$ (Ω) | Power loss |
|---|---|---|---|
| Conventional art example 1 | 1 | 100 | 1 |
| Conventional art example 2 | 2 | 1.1 | 1/16 |
| Present invention example 1 | 1 | 64 | 4/5 |
| Present invention example 2 | 1 | 7.3 | 1/10 |
| Present invention example 3 | 1.04 | 4.0 | 1/17 |
| Present invention example 4 | 1.04 | 1.1 | 1/60 |

It is understood from Table 1 that the power loss of present invention examples 1 through 4 is reduced compared to that of conventional art example 1. It is also understood that the power loss of present invention examples 3 and 4 is reduced compared to that of conventional art example 2. Conventional art example 2, although significantly reducing the power loss, has a disadvantage in that an increase in the parasitic capacitance $C_p$ reduces the cutoff frequency $f_t$ of the MOS transistor receiving a signal which is input to the bonding pad. Conventional art example 2 has a further disadvantage in that, as a result of breakdown of the insulating layer caused by the force applied at the time of bonding, two metal plates may be undesirably shortcircuited or one of the metal plates and the silicon substrate may be undesirably shortcircuited.

The specific structures of conventional art examples 1 and 2 and present invention examples 1 through 4 are as follows.

Figure 22:
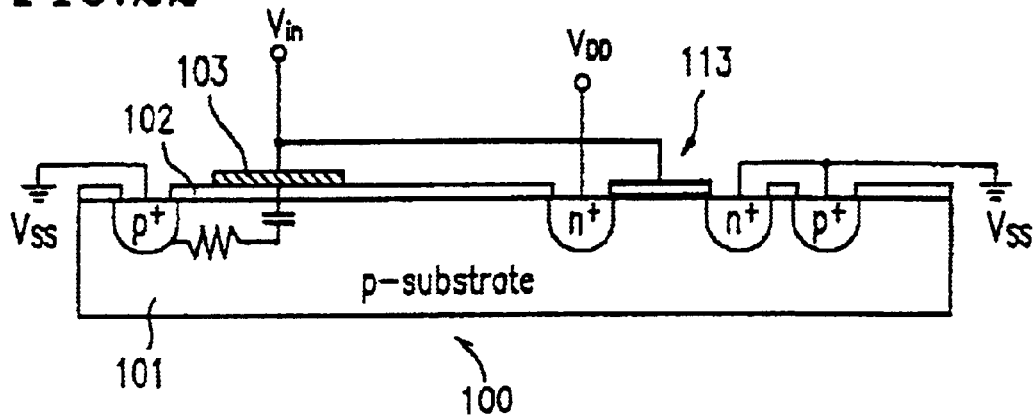
FIG. 22 is a view showing a structure of a semiconductor integrated circuit 100 including a bonding pad 103.
Figure 23:
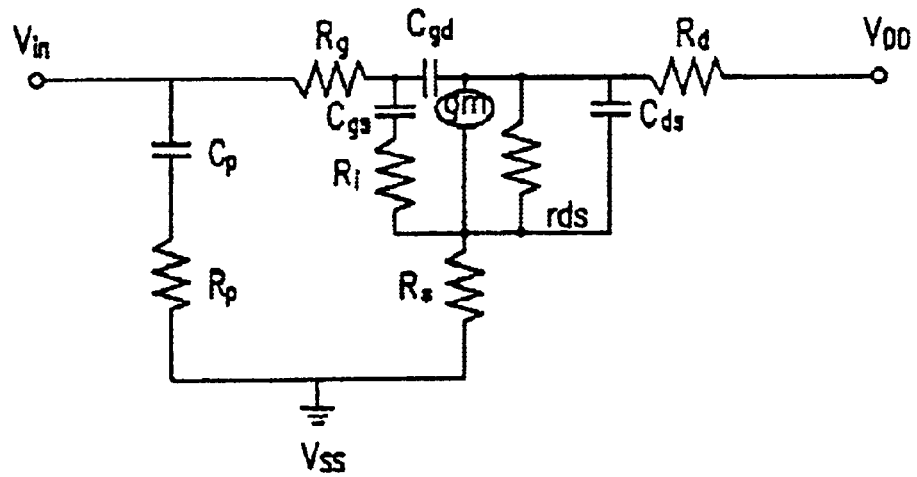
FIG. 23 is a view showing an equivalent circuit of the semiconductor integrated circuit 100.

Conventional art example 1: semiconductor integrated circuit including a bonding pad and a semiconductor substrate facing the bonding pad through an insulating layer interposed therebetween (see FIG. 22)

Conventional art example 2: semiconductor integrated circuit described in IEEE JOURNAL OF SOLID-STATE CIRCUITS, VOL. 31, NO. 7, JULY 1996, page 886, FIG. 10

Present invention example 1: semiconductor integrated circuit in the first example according to the present invention (conductive layer: frame-shaped, without low resistance layer)

Present invention example 2: semiconductor integrated circuit in the second example according to the present invention (conductive layer: frame-shaped, with low resistance layer)

Present invention example 3: semiconductor integrated circuit in the third example according to the present invention (conductive layer: 5×5 mesh type, without low resistance layer)

Present invention example 4: semiconductor integrated circuit in the third example according to the present invention (conductive layer: 5×5 mesh type, with low resistance layer)

The conditions by which the results shown in Table 1 are obtained are as follows.

*Distance $D_{BS}$ between the bonding pad and the semiconductor substrate: 2d

*Distance $D_{BC}$ between the bonding pad and the conductive layer: d (i.e., $D_{BC}=\frac{1}{2}D_{BS}$)

*Capacitance between the bonding pad and the semiconductor substrate: 0.1 fF/$\mu$m$^2$ (i.e., capacitance between the bonding pad and the conductive layer: 0.2 fF/$\mu$m$^2$)

*Sheet resistance ρ of the semiconductor substrate: 1000 Ω (except that ρ=50 Ω for present invention examples 2 and 4)

*Size of bonding pad: 100 $\mu$m×100 $\mu$m

Figure 19:
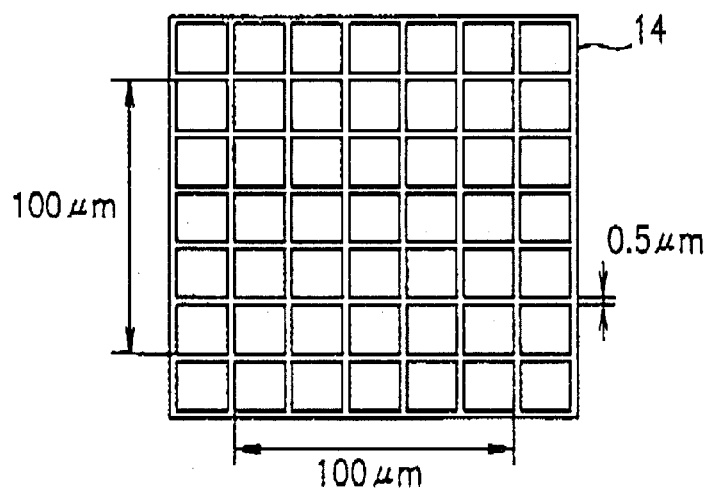
FIG. 19 is a plan view showing a shape of a 5×5 mesh type conductive layer 14.
Figure 20:
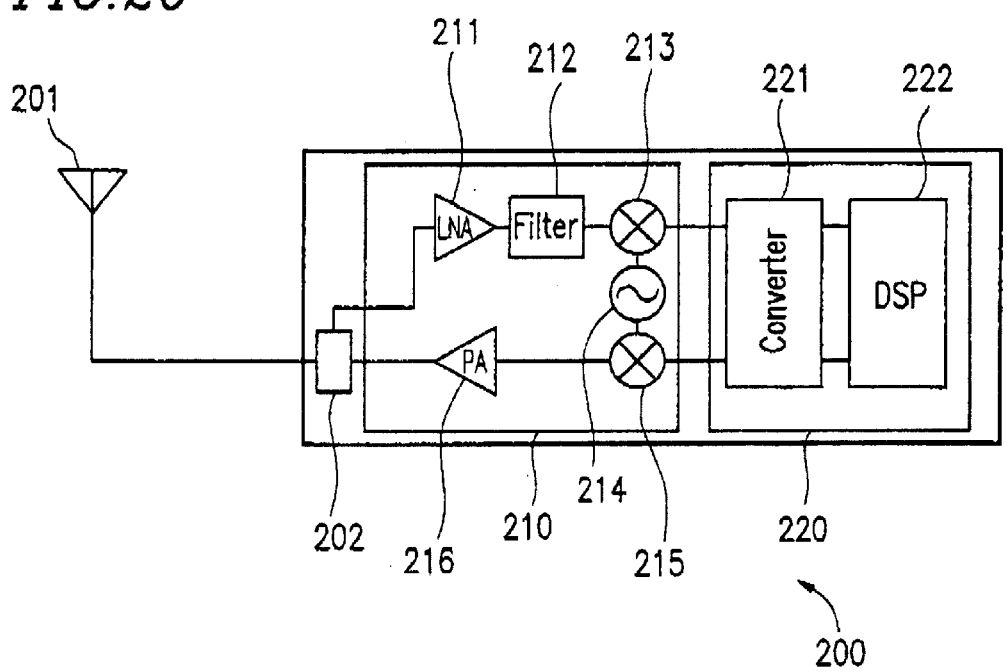
FIG. 20 is a view showing a structure of a conventional communication system 200.
Figure 21:
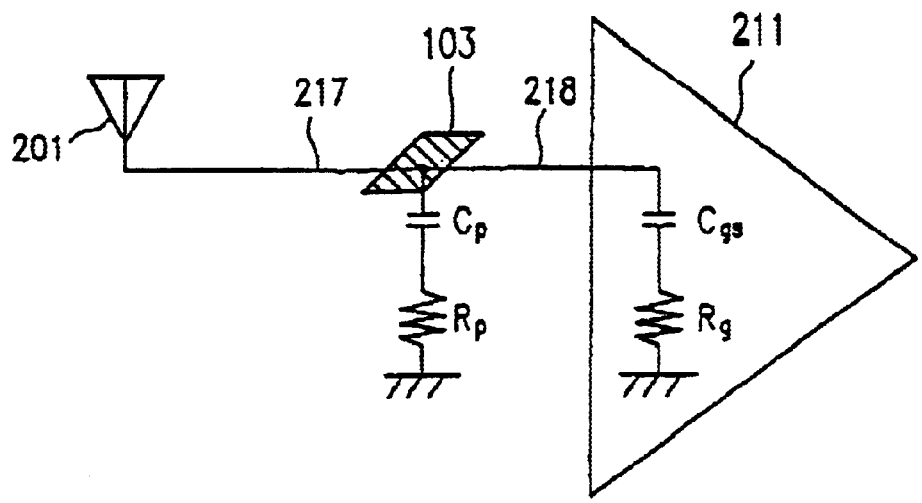
FIG. 21 is a view schematically showing an equivalent circuit from an antenna 201 to an LNA 211 of the conventional communication system 200.

*5×5 mesh type conductive layer: see FIG. 19; width of the conductive layer=0.5 $\mu$m (parasitic capacitance $C_p$ is calculated in accordance with the following expression)

$$C_p=0.1\times(100\times100-100\times0.5\times8)+0.2\times100\times0.5\times8=1.04 \text{ pF}$$

INDUSTRIAL APPLICABILITY

According to a semiconductor integrated circuit of the present invention, the parasitic resistance $R_p$ can be reduced without substantially increasing the parasitic capacitance $C_p$. Thus, the power lose and noise generation caused by the parasitic element in the bonding pad can be reduced.

The semiconductor integrated circuit according to the present invention is applicable for a pad structure used in a receiving section of a communication system for receiving a signal. Thus, the power loss and noise generation caused when the signal is received can be reduced. The semiconductor integrated circuit according to the present invention is applicable for a pad structure used in a transmitting section of a communication system for transmitting a signal. Thus, the power loss and noise generation caused when the signal is transmitted can be reduced.

Especially, the semiconductor integrated circuit according to the present invention is suitable for a pad structure used for transmitting or receiving a signal having a high frequency (e.g., 100 MHz or more).

What is claimed is:

1. A semiconductor integrated circuit, comprising:
   a bonding pad;
   a semiconductor substrate electrically insulated from the bonding pad and having a first region and a second region defined in a surface of the semiconductor substrate facing the bonding pad with the second region (a) at least partially surrounding the first region only in a plane parallel to a surface of the semiconductor substrate facing the bonding pad, wherein a part of the first region is not surrounded by the second region and said part corresponds to a fan-shaped area, and (b) defined such that substantially no portion of the second region is directly under the bonding pad; and only the first region is under the bonding pad; and
   setting means for setting the second region of the semiconductor substrate substantially at an equipotential;
   the setting means includes a conductive section having a plurality of basic cells arranged in an array; and
   said semiconductor integrated circuit further comprises a low resistance layer in said semiconductor substrate.

2. A semiconductor integrated circuit according to claim 1, wherein the setting means includes:
   voltage supply means for supplying a prescribed voltage; and
   connecting means for electrically connecting the voltage supply means to the second region of the semiconductor substrate.

3. A semiconductor integrated circuit according to claim 2, wherein the connecting means includes the conductive section electrically connected to the voltage supply means and a plurality of contact portions discretely formed, and the plurality of contact portions each electrically connect the conductive section to the second region of the semiconductor substrate.

4. A semiconductor integrated circuit according to claim 3, wherein a shape of the second region of the semiconductor substrate is determined by a shape of the conductive section.

5. A semiconductor integrated circuit according to claim 3, wherein the conductive section has a shape substantially surrounding the first region of the semiconductor substrate.

6. A semiconductor integrated circuit according to claim 2, wherein the connecting means includes the conductive section electrically connected to the voltage supply means and a contact portion continuously formed, and the contact portion electrically connects the conductive section to the second region of the semiconductor substrate.

7. A semiconductor integrated circuit according to claim 1, wherein the second region of the semiconductor substrate is located outside the first region of the semiconductor substrate.

8. A semiconductor integrated circuit according to claim 1, wherein the second region of the semiconductor substrate is located inside the first region of the semiconductor substrate.

9. A semiconductor integrated circuit according to claim 1, wherein the equipotential is a ground potential.

10. A semiconductor integrated circuit according to claim 1, wherein said low resistance layer having a sheet resistance smaller than a sheet resistance of said semiconductor substrate by one or more orders of magnitude.

11. A system, comprising:
    a transmitting and receiving section for transmitting or receiving a signal;
    a processing section for processing the signal to be transmitted or the signal received;
    the transmitting and receiving section including a bonding pad and a semiconductor substrate electrically insulated from the bonding pad;
    the semiconductor substrate having a first region and a second region defined in a surface of the semiconductor substrate facing the bonding pad with the second region (a) at least partially surrounding the first region only in a plane parallel to the surface of the semiconductor substrate facing the bonding pad, wherein a part of the first region is not surrounded by the second region and said part corresponds to a fan-shaped area, and (b) defined such that substantially no portion of the second region is directly under the bonding pad; and
    a conductive section contacting the semiconductor substrate, the conductive section having a plurality of basic cells arranged in an array;
    the second region of the semiconductor substrate is set substantially at an equipotential; and
    said transmitting and receiving section further comprises a low resistance layer in said semiconductor substrate.

12. A system according to claim 11, wherein the transmitting and receiving section transmits or received the signal through an antenna.

13. A system according to claim 11, wherein the transmitting and receiving section transmits or receives the signal through an interface for connecting different semiconductor chips.

14. A system according to claim 11, wherein the signal has a frequency of 100 MHz or more.

15. A system according to claim 11, wherein the transmitting and receiving section and the processing section are formed on a single semiconductor chip.

16. A system according to claim 11, wherein the transmitting and receiving section transmits and receives the signal.

17. A system according to claim 11, wherein said low resistance layer having a sheet resistance smaller than a sheet resistance of said semiconductor substrate by one or more orders of magnitude.

18. A system according to claim 11, wherein the equipotential is a ground potential.

* * * * *